United States Patent
Roth et al.

(10) Patent No.: US 10,042,017 B2
(45) Date of Patent: Aug. 7, 2018

(54) NMR SPECTROMETER COMPRISING A SUPERCONDUCTING MAGNETIC COIL HAVING WINDINGS COMPOSED OF A SUPERCONDUCTOR STRUCTURE HAVING STRIP PIECES CHAINED TOGETHER

(71) Applicant: BRUKER BIOSPIN GMBH, Rheinstetten (DE)

(72) Inventors: Gerhard Roth, Rheinstetten (DE); Arne Kasten, Karlsruhe (DE); Klaus Schlenga, Karlsruhe (DE); Alexander Usoskin, Hanau (DE)

(73) Assignee: Bruker BioSpin GmbH, Rheinstetten (DE)

( * ) Notice: Subject to any disclaimer, the term of this patent is extended or adjusted under 35 U.S.C. 154(b) by 301 days.

(21) Appl. No.: 15/024,414

(22) PCT Filed: Oct. 2, 2014

(86) PCT No.: PCT/EP2014/071207
§ 371 (c)(1),
(2) Date: Mar. 24, 2016

(87) PCT Pub. No.: WO2015/049357
PCT Pub. Date: Apr. 9, 2015

(65) Prior Publication Data
US 2016/0216348 A1     Jul. 28, 2016

(30) Foreign Application Priority Data
Oct. 4, 2013   (DE) .................. 10 2013 220 141

(51) Int. Cl.
*H01F 6/06*     (2006.01)
*G01R 33/3815*     (2006.01)
(Continued)

(52) U.S. Cl.
CPC ......... *G01R 33/3815* (2013.01); *G01R 33/46* (2013.01); *H01F 6/06* (2013.01); *H01F 6/065* (2013.01); *H01L 39/143* (2013.01)

(58) Field of Classification Search
CPC ........ G01R 33/3815; H01F 6/06; H01F 6/065
See application file for complete search history.

(56) References Cited

U.S. PATENT DOCUMENTS

| 6,121,205 A | 9/2000 | Murakami |
| 6,828,507 B1 | 12/2004 | Fritzemeier |

(Continued)

FOREIGN PATENT DOCUMENTS

| EP | 0 413 573 | 2/1991 |
| EP | 0 545 608 | 6/1993 |
| EP | 2 645 382 | 10/2013 |

OTHER PUBLICATIONS

"YBCO Coated Conductors", Jul. 2013, www.bruker.com/products/superconductors-and-metal-composite-materials/superconductors/ybco-2g-hts-superconductors/learn-more.html.

*Primary Examiner* — Ramon M Barrera
(74) *Attorney, Agent, or Firm* — Paul Vincent

(57) ABSTRACT

An NMR spectrometer (131) with an NMR magnet coil (91) having windings of a conductor with a superconducting structure (1), which have a plurality of band-segments (2, 2a, 7a-7e, 8a-8d, 15) made of band-shaped superconductor. Each band-segment (2, 2a, 7a-7e, 8a-8d, 15) has a flexible substrate (3) and a superconducting layer (4) deposited thereon, wherein the band-segments (2, 2a, 7a-7e, 8a-8d, 15) each have a length of 20 m or more. At least one of the band-segments (2, 2a, 7a-7e, 8a-8d, 15) forms a linked band-segment (2, 2a), and each linked band-segment (2, 2a) is connected to at least two further band-segments (7a-7e) in such a way that the combined further band-segments (7a-7e) overlap with at least 95% of the total length (L) of the linked (Continued)

band-segment (2, 2*a*). The magnet coil generates particularly high magnetic fields in a sample volume and has a low drift.

21 Claims, 14 Drawing Sheets

(51) Int. Cl.
    *H01L 39/14*     (2006.01)
    *G01R 33/46*     (2006.01)

(56) References Cited

U.S. PATENT DOCUMENTS

| | | |
|---|---|---|
| 9,159,897 B2 | 10/2015 | Schlenga |
| 2002/0144838 A1 | 10/2002 | Fritzemeier |
| 2003/0132023 A1 | 7/2003 | Morita |
| 2003/0213611 A1 | 11/2003 | Morita |
| 2004/0135659 A1 | 7/2004 | Schlenga |
| 2005/0173679 A1 | 8/2005 | Mannhart |
| 2012/0065074 A1* | 3/2012 | Xie .................. H01R 4/68 |
| | | 505/234 |

* cited by examiner

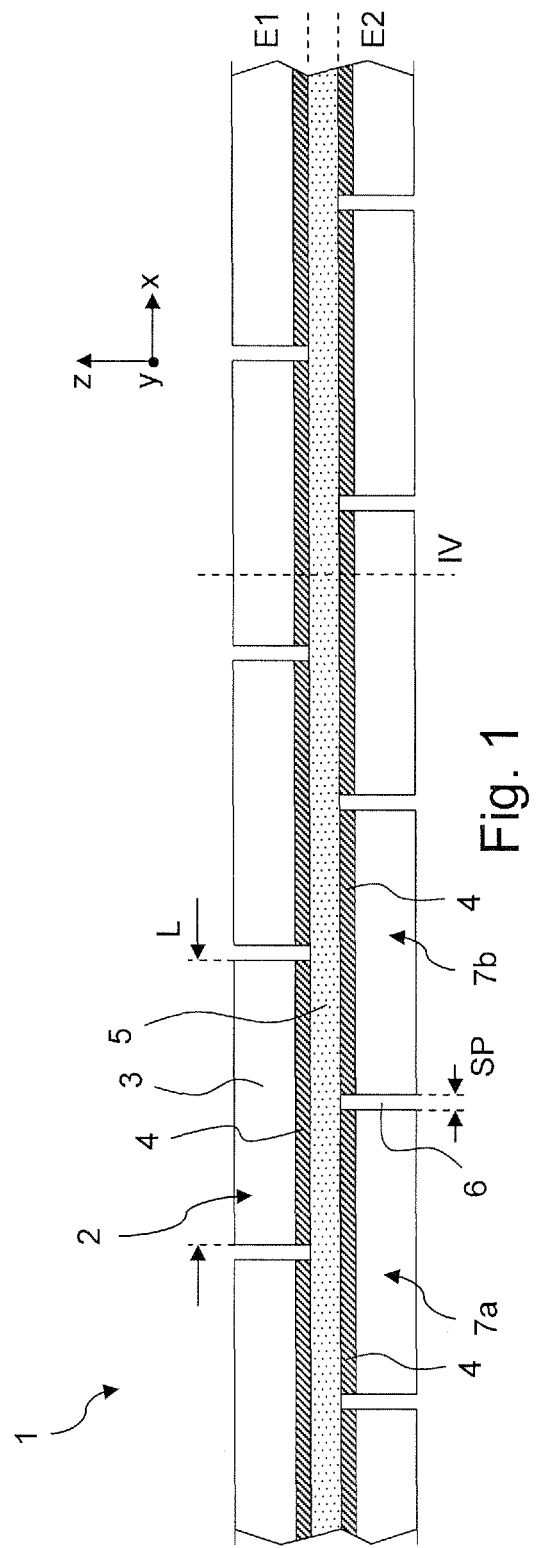
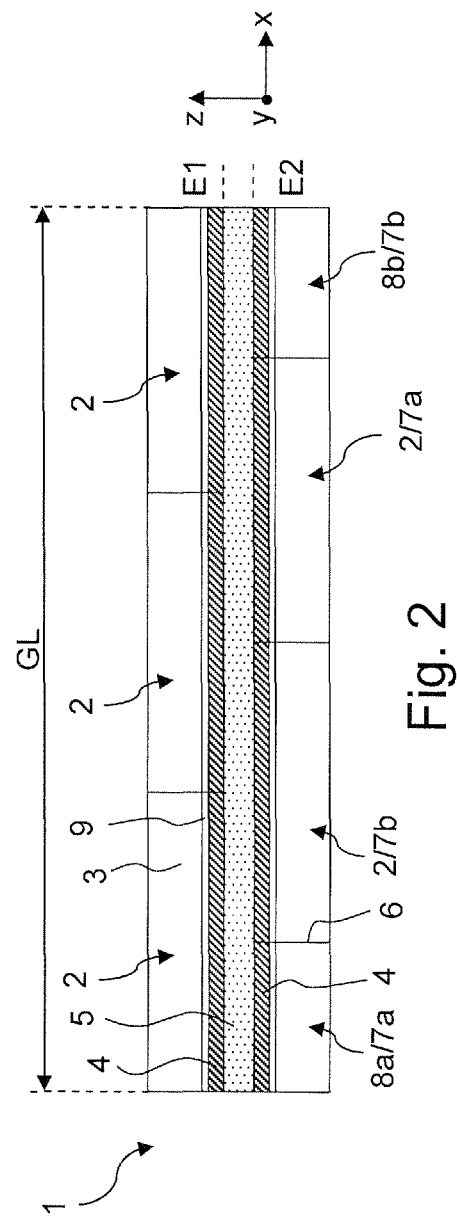

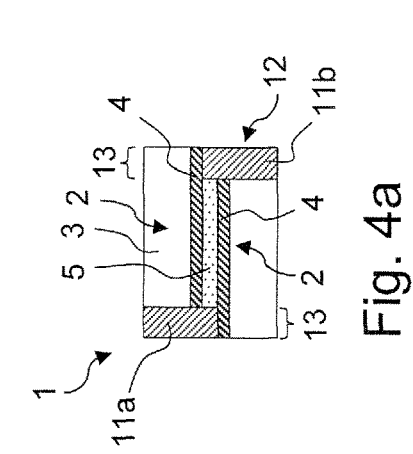
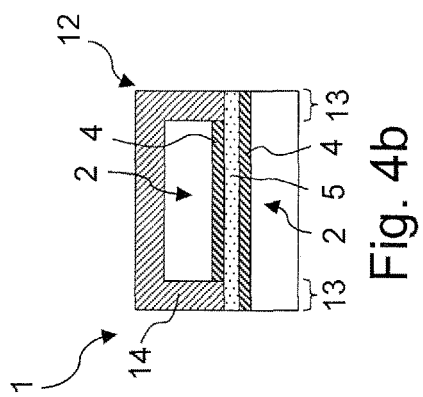
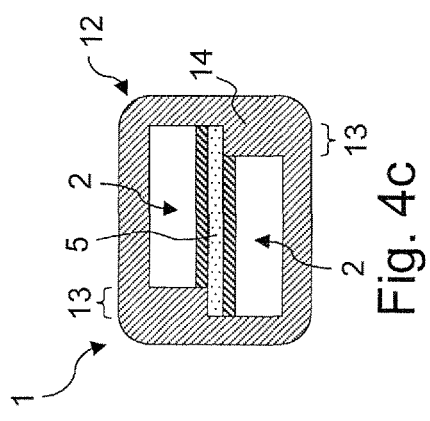
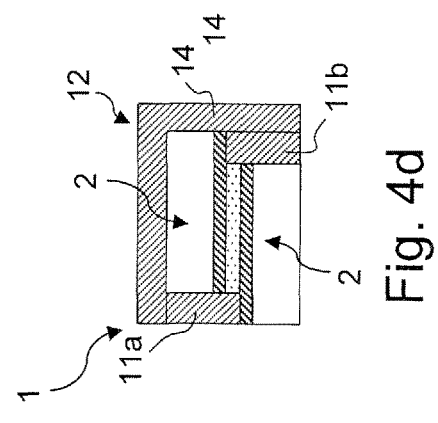
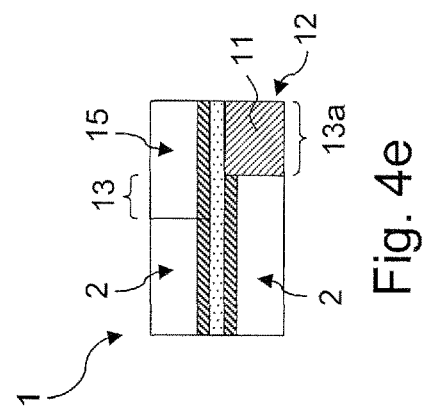
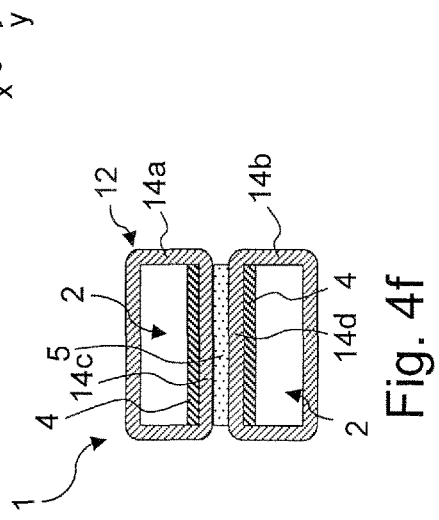

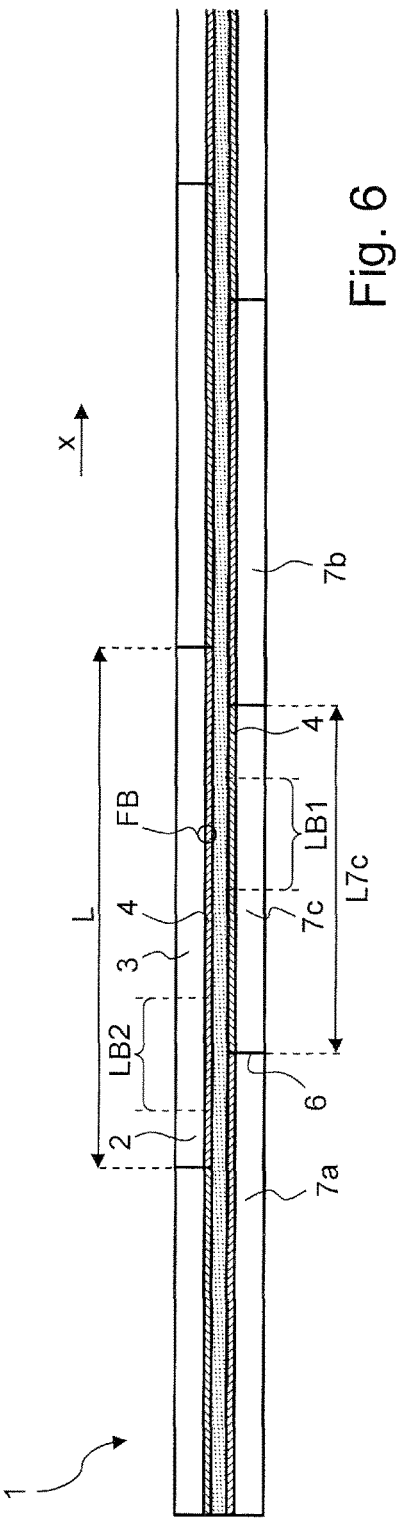
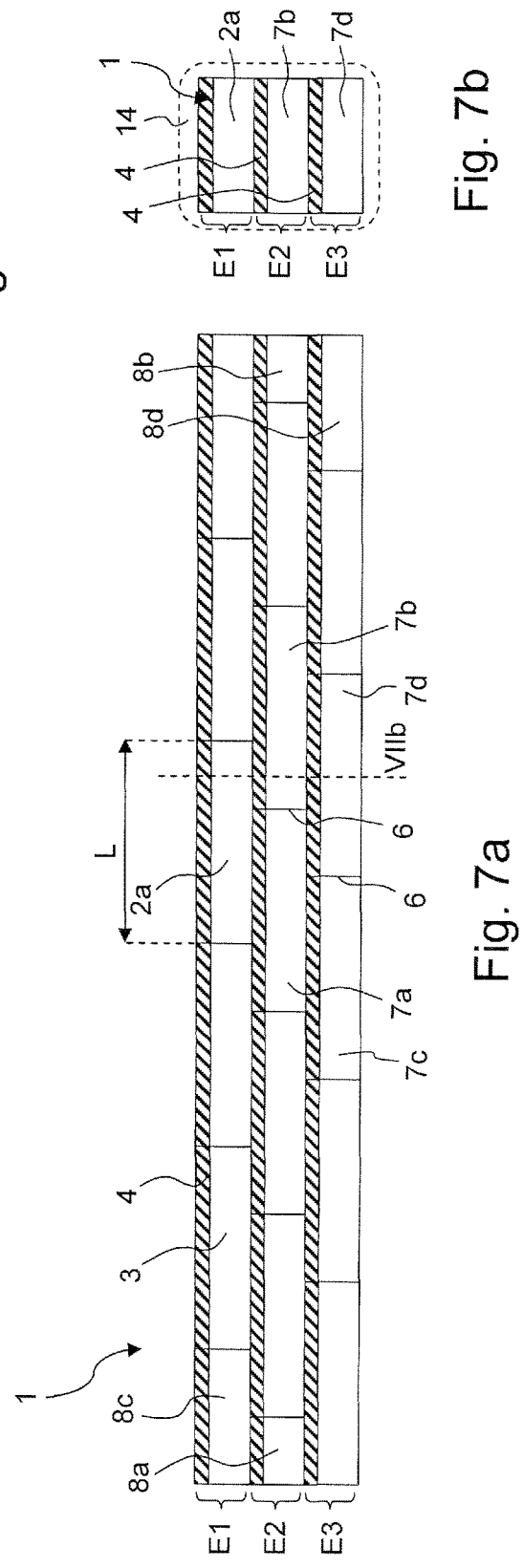
Fig. 6
Fig. 7a
Fig. 7b

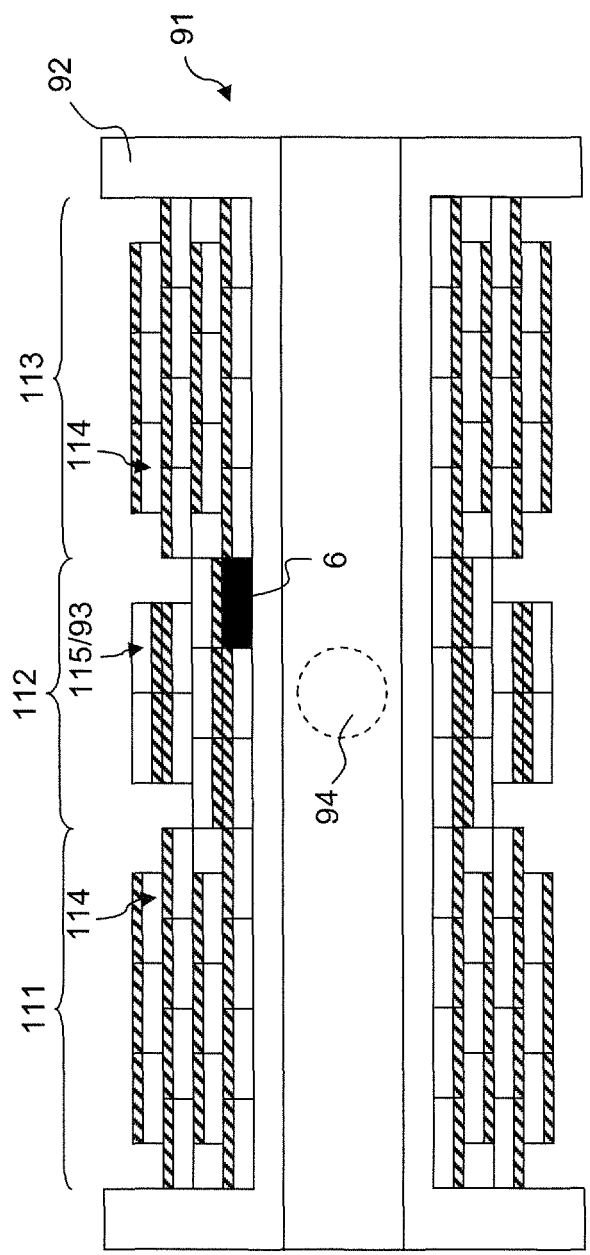
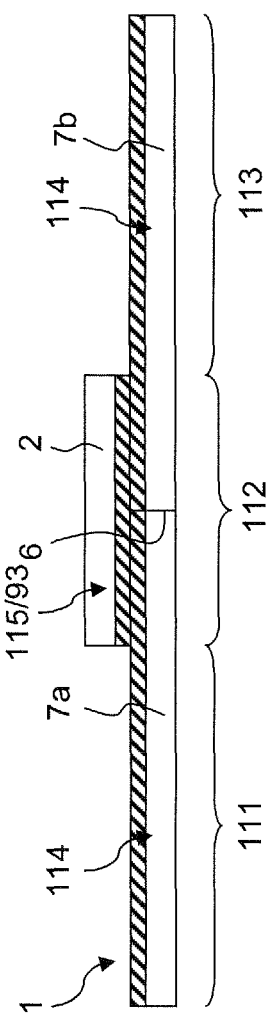
Fig. 11a
Fig. 11b

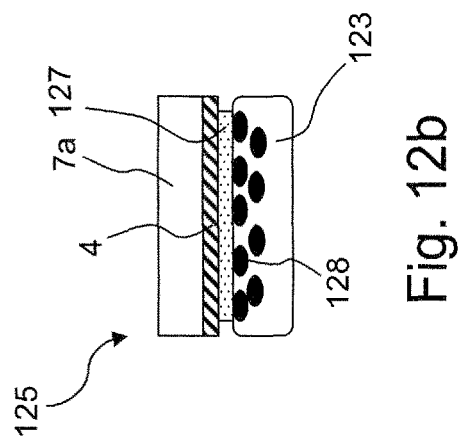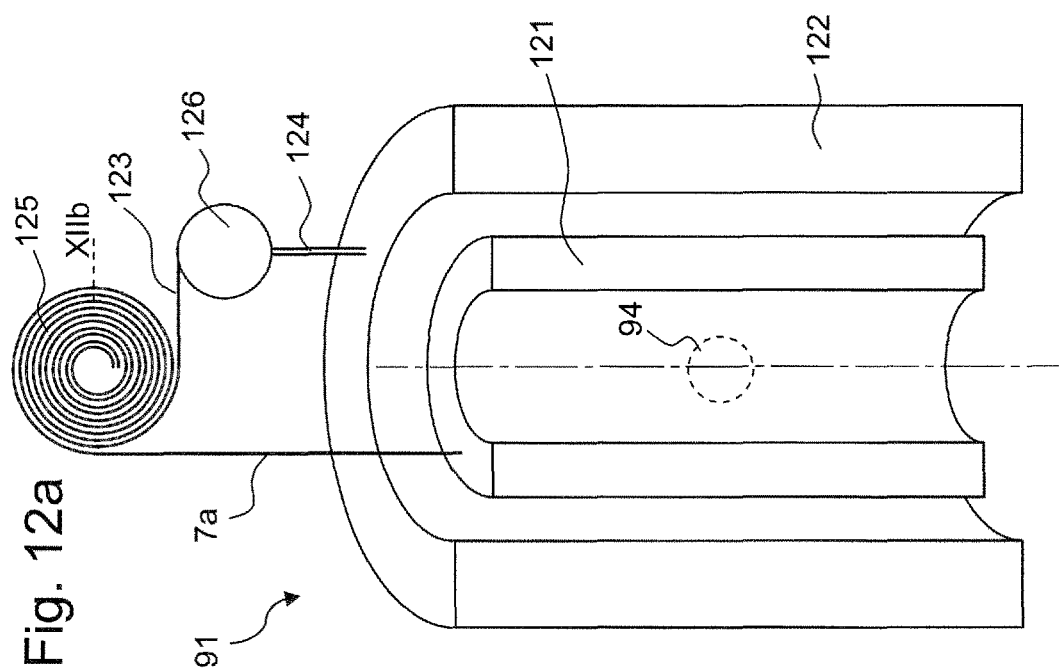

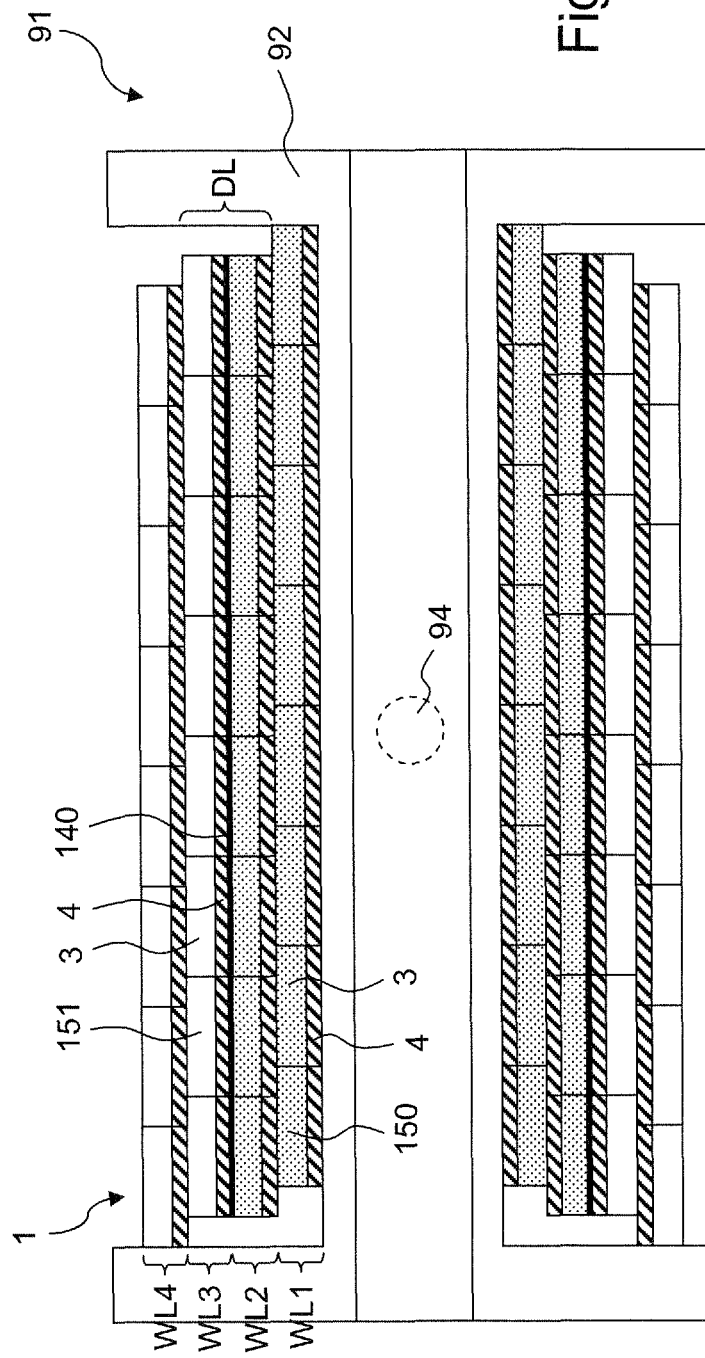
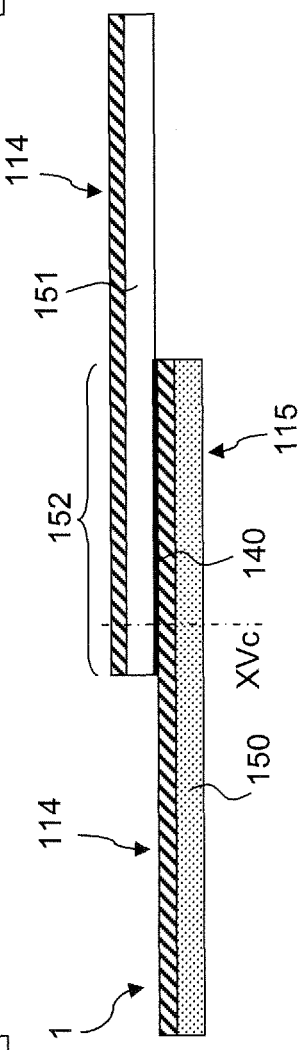
Fig. 15a
Fig. 15b

NMR SPECTROMETER COMPRISING A SUPERCONDUCTING MAGNETIC COIL HAVING WINDINGS COMPOSED OF A SUPERCONDUCTOR STRUCTURE HAVING STRIP PIECES CHAINED TOGETHER

This application is the national stage of PCT/EP2014/071207 filed on Oct. 2, 2014 and also claims Paris convention priority from DE 10 2013 220 141.9 filed Oct. 4, 2013.

BACKGROUND OF THE INVENTION

The invention relates to an NMR spectrometer with an NMR magnet coil, of which at least one section comprises windings of conductors having a superconducting structure, the structure comprising a plurality of band-segments of band-shaped superconductors, each band-segment comprising a substrate and a superconducting layer deposited thereon, and the band-segments being jointed to each other. The superconducting magnet coil windings are made from a superconducting structure with linked band-segments, which are each overlapped by directly sequential, further band-segments.

Superconductors can carry electrical currents practically without any ohmic losses. They are especially deployed where high electrical currents are required, for example, in magnet coils.

Superconductors can carry loss-free electrical currents up to a critical current density only below a critical temperature (also called transition temperature) and below a temperature-dependent critical magnetic field strength that may also be direction-dependent. Above these critical parameters, i.e. critical current density, critical temperature and critical magnetic field strength which depend on each other, the superconductor enters a normally conductive state.

Metal superconducting materials, such as NbTi, which can be processed as wires, have a relatively low critical temperature (for NbTi, for example, it is about 9K), making their use quite expensive, especially with respect to the necessary cooling. Moreover, metal superconductors have relatively low critical magnetic fields, above which they lose their superconductive properties.

High-temperature superconductors (HTSL), such as yttrium barium copper oxide (YBCO), have significantly higher critical temperatures, YBCO for example, about 90K, but are difficult to process due to their ceramic properties. If they are used at temperatures significantly below their critical temperature, HTSLs can conduct comparatively large currents, i.e. they have a high critical current density. With their comparatively high critical magnetic field strengths, these materials are also suitable for low operating temperatures in strong magnetic fields, as for example desired in NMR spectrometers, in order to achieve high spectral resolution.

For technical applications, HTSLs are usually deposited as a thin layer onto band-shaped, usually metal substrates, wherein, as a rule, one or more buffer layers are interposed between the substrate and the superconducting layer, and one or more final metal layers are deposited on top of the superconducting layer. This type of construction is also termed a band-shaped superconductor and has commonly become known as a "coated conductor".

However, depositing superconducting layers of good quality is relatively difficult. As a rule, substrate surfaces with a special texture are required, which can only be provided over limited lengths. Currently, good-quality band-segments of band-shaped superconductors are limited to a maximum range of approx. 100 to 500 m. As a consequence, the size of coil sections that can be wound in magnet coils is limited, i.e. in NMR spectrometers. A connection of band-segments by means of joints in a magnet coil is technologically difficult and generally increases the drift of the magnet coil, which is in particular undesirable in the field of high resolution NMR spectroscopy.

EP 0 545 608 A2 proposes joining conductor segments, which can only be manufactured in good quality in limited lengths, in order to enable current to be transported over longer distances, for instance, several kilometers.

US 2005/0173679 A1 discloses the joining of two band-segments of band-shaped superconductors, wherein the superconducting layers on the respective substrates face each other. The superconducting layers are to be in superconducting contact and the proximity of the two polycrystalline superconducting layers is intended to increase the effective grain boundary surface and thus improve the critical current.

U.S. Pat. No. 6,828,507 B1 also discloses the joining together of two band-segments of band-shaped superconductors, wherein the superconducting layers on the respective substrates face each other. The superconducting layers are joined by means of one or more normally conducting intermediate layers (for instance, covering layers of the individual band-segments).

U.S. Pat. No. 6,121,205 A discloses superconducting structures comprising a plurality of overlappingly connected superconductor units, the superconductor units each comprising a substrate consisting of a metal oxide crystal, e.g. of $ZrO_2$ or MgO, and a superconducting layer, e.g. of ReBCO material. In the superconducting structures, the superconducting layers of the superconductor units face each other.

US 2003/0213611 A1 discloses a superconducting structure consisting of a plurality of overlappingly connected bar-shaped superconductor units of solid YBCO. The bar-shaped superconductor units may in particular be arranged in three stacked planes and be connected along a straight direction. In one described embodiment, the superconductor material forms a thin layer on a single-crystalline MgO substrate.

DE 600 31 784 T2 discloses an arrangement of two elements coated by HTS, which elements are connected to each other with their HTS layers facing each other via metallic cover layers. The HTS covered elements may be arranged such that they are slightly offset with respect to each other in a direction transverse to their direction of longitudinal extension.

The object of the invention is to provide an improved NMR spectrometer, in particular with a magnet coil of the spectrometer being able to generate particularly high magnetic field strengths within a sample volume and having a low drift. In particular, an NMR spectrometer shall be provided wherein the magnet coil has a high current carrying capacity in high magnetic field strengths and may, during operation, be short-circuited via a switch and is suitable to generate a homogeneous, temporally extremely stable magnetic field within a sample volume inside the magnet coil, i.e. such that in persistent mode operation a drift of the generated magnetic field caused by residual resistances of the conductors of the magnet coil, of the joints between its sections and/or of the switches stays within tolerable limits, e.g. for high resolution NMR spectroscopy.

SUMMARY OF THE INVENTION

This object is achieved with an NMR spectrometer with an NMR magnet coil, comprising at least in one section windings of a conductor with a superconducting structure, which structure comprises a plurality of band-segments of band-shaped superconductors, wherein each band-segment comprises a flexible substrate and a superconducting layer deposited thereon, each of the band-segments having a length of 20 m or more, and the band-segments being connected to each other, at least one of the band-segments being a linked band-segment, and each linked band-segment being connected to at least two further band-segments in such a way that the further band-segments together overlap with at least 95% of the total length of the linked band-segments. The band-segments may be commercially available superconductor tapes, as described further above.

In at least one section of the magnet coil of the NMR spectrometer according to the invention, the superconducting structure is based on one or more linked band-segments. In the range of the links, the superconducting structure has a particularly high current carrying capacity, which can tolerate locally occurring inhomogeneities of the critical current density and a resulting locally occurring (still very small) ohmic resistance during operation of the magnet coil (with a current that, as a rule, is considerably lower than the critical current). Electrical current may be exchanged between the linked, parallel band-segments that face each other. In case of inhomogeneities of the critical current density (e.g. normally conducting ns in a superconducting layer) in one of the band-segments these are bridged by the corresponding opposite band-segment and vice versa, with the result that such inhomogeneities do not cause any noticeable impairment of the current carrying capacity of the total superconducting structure. In particular, this also holds in case of the most massive disturbance of this kind, i.e. at gaps, where the band-segments are pieced on.

Moreover, the contact areas between the band-segments facing each other are very large. Within the frame of the present invention, generally the entire length of a linked band-segment may be used for the transverse current exchange, rendering the contact resistance (transverse resistance) very small. In particular, it is possible to use one or more layers of normally conducting material as a contact between the superconducting layers without thereby increasing the ohmic resistance to a noticeable level. Nevertheless, these normally conducting layers should be made from materials with good electrical conductivity (for example noble metals or copper or alloys of these metals). These intermediate layers may simplify the production process of the superconducting structure and may also be helpful as thermal conductors and as current paths running parallel to the superconducting layers in order to stabilize the superconducting state and as quench protection. In particular, the parallel band-segments may also be connected by means of simple soldering of a respective copper cover. In general, the soldering extends along the band direction more than 5 m, preferably more than 20 m. At any rate, it comprises a plurality of windings in the section.

Within the frame of the invention it is possible to avoid the generation of noticeable ohmic conductor resistances, also in the case of linking a large number of band-segments in a row. In this way, the invention is also well suited for coils with a large number of windings, e.g. in the kilometer range. For NMR purposes, a resulting total transverse resistance below some 10 nOhm is desirable and one order of magnitude more is barely acceptable. Soldering of two band-segments via the copper enclosure resulted for typical, commercially available HTS tape conductors in a transverse resistance of about 40 $nOhm/cm^2$.

Within the frame of the invention, the connection of two band-segments with their superconducting layers next to each other (facing each other) may also result in a superconducting or quasi-superconducting electrical contact, such that in total a vanishing ohmic resistance results. If a copper cover of the tape conductor encases the substrate, the tapes may also be soldered as stacks, i.e. the superconducting layers need not face each other (in a mirrored way). Therefore it becomes possible (at the cost of an increased transverse resistance) to keep the substrate layer of the individual tape consequently in the radially outward position, thereby decreasing the risk of detaching of the superconducting layer by Lorentz forces.

A band-segment is designated a linked band-segment, if it is connected to at least two further band-segments, which combined (in an extension direction of the band-segments/longitudinal direction) essentially overlap with the entire length of the band-segment. In this way, the further band-segments may serve as a parallel current path for the linked band-segment, in particular at ranges of defects in the linked band-segment. Vice versa, the linked band-segment provides a parallel current path for the further band-segments, in particular at gaps (touch points) between the further band-segments.

One or more (in particular also all) of the further band-segments, which are overlappingly connected to a linked band-segment according to the invention, may on their turn be linked band-segments. Therefore, in a simple way, effectively arbitrary winding lengths may be realized with the superconducting structure according to the invention. Moreover, a band-segment of the superconducting structure may also serve as a further band-segment with respect to one or more linked band-segments.

Between the further band-segments following each other in longitudinal direction of the superconducting structure, an (as narrow as possible) gap (abutting ends, fitting range) is formed, being bridged by the linked band-segment. Moreover, usually, each of the further band-segments extends in longitudinal direction on one end beyond the linked band-segment.

The NMR magnet coil of the NMR spectrometer according to the invention comprises in an un-shimmed state, preferably in a sample volume of at least 1 $cm^3$, most preferred of at least 10 $cm^3$, a homogeneity of 100 ppm or better, preferably 10 ppm or better, most preferred 2 ppm or better and generates across that sample volume preferably a magnetic flux density of 10 Tesla or more, in particular of 20 Tesla or more, or also 23.5 Tesla or more, for example 28.2 Tesla (=1200 MHz proton resonance frequency). The band-segments of the superconducting structure each comprise a flexible, preferably metallic substrate, e.g. from steel, that can be wound up, in particular about a section of the NMR magnet coil. Typical widths of the band-segments are in the range of 2 mm to 60 mm. Typical thicknesses of the band-segments are in the range of 25 µm to 300 µm. The lengths of the band-segments lie in the order of 20 m or longer, mostly 100 m or longer.

In a preferred embodiment of the NMR spectrometer according to the invention the superconducting structure comprises at least N linked band-segments with $N \geq 5$, preferably $N \geq 20$. In particular, the N linked band-segments are sequentially connected to each other in such a way that at least one of the further band-segments of each of the linked band-segments is on its turn a linked band-segment. In this way, the superconducting structure including its advantages may be used for arbitrary, in particular also large lengths. For all (with respect to the tape direction) inner band-segments of a sequence of sequential, linked band-segments, being sequentially linked to each other, two further band-segments are respectively linked band-segments, and for both outer band-segments of the sequence merely one of the further band-segments forms a linked band-segment. The superconducting structure of this variant comprises basically parallel band-segments in at least two planes (upper and lower plane). The linked band-segments in the upper plane are arranged in a row, preferably with their superconducting layers oriented towards their lower side, and the linked band-segments in the lower plane are also arranged in a row and preferably with their superconducting layers oriented towards their upper side.

In a preferred variant of this embodiment, the superconducting structure is constructed periodically via the linked band-segments along the direction of extension of the linked band-segments. This measure renders the construction particularly easy; in particular band-segments of equal length may be used in the design.

In a preferred embodiment, at least one linked band-segment comprises at least one known defect, and at least one of the further band-segments, overlapping with this particular linked band-segment, is chosen such and/or positioned in longitudinal direction such that the further band-segment is free of defects in a first longitudinal range about the known defect area, in particular in a first longitudinal range of at least 10 m on both sides of the known defect area. In case of known (and accepted) locations of defect areas in a particular band-segment, this band-segment should be connected to an overlapping band-segment, which is chosen such and, if needs be, shifted longitudinally that this overlapping band-segment is free of defects in a longitudinal range about the known location of defect of the first band-segment, as a rule along a range of about 10 m to some ten meters. This range just allows a current transfer with a sufficiently low ohmic transverse resistance.

Of course, analogously, this is also true in particular for the most relevant defect areas, namely wherever two band-segments are pieced together. Consequently, an embodiment is preferred, where the linked band-segment is free of defects in a second longitudinal range about a gap between two further band-segments, which are overlappingly connected with this linked band-segment, in particular in a second longitudinal range of at least 10 m towards both sides of the gap In a preferred embodiment, the section comprises a plurality of radial winding layers, and locations of the gaps between two further band-segments, which are overlappingly connected to the same linked band-segment, are azimuthally displaced in winding layers that radially lie on top of each other. Since positions where band-segments are pieced together (gaps) are also potential mechanical weak spots, they should, in case of multi-layered windings, not be positioned radially on top of each other nor longitudinally next to each other. In this way, the mechanical stability of the magnet coil may be increased. Insofar, preferably and wherever possible, one should consider already during production of a conductor with a structure of linked band-segments, where critical conductor-segments will later end up in the coil section. To this end, specific available band-segments may purposefully be shortened and jointed in order to fulfil the above-mentioned criteria.

Accordingly, it is furthermore advantageous that the section comprises several axially neighboring windings in at least one winding layer, and that gaps in the same winding layer are azimuthally displaced.

In an advantageous embodiment of the NMR spectrometer according to the invention, the section comprises at least one single-band partial section being wound with a single, continuous band-segment, and also comprises at least one multiple-band partial section, being wound with a conductor having the superconducting structure. In case that large lengths of a tape conductor without defects are available, which, however, are not sufficient to wind the entire desired coil section continuously, single-band partial sections may be formed which are wound only from a continuous tape conductor (band-segment and with full current density), and furthermore multi-tape partial sections with linked band-segments (with reduced current density). One possible design within a magnet coil could be an axially inner partial section with links, axially surrounded by two partial sections with continuous tape conductor. However, alternatively, one may e.g. also switch from winding layer to winding layer from a single-band to a linked double-band (and, if appropriate, back). In extreme cases, one layer in a double-band with the single-band linked thereto serves as a (quasi-) superconducting joint within a section. This may be achieved in two advantageous ways. In a first variant, the single-band rises at an axial end of the section to the radially next but one winding layer. In the intermediate winding layer there is a further band-segment co-wound from the section end which covers the section until its other axial end. The original band-segment and the co-wound band-segment are soldered to form a double-band until about the axial center of the section. There (in the next but one layer) the original band-segment ends and a new band-segment is pieced to it and soldered to the co-wound band-segment (until the axial end of the section). In this way, the coil current is transferred via the first axial half from the original band-segment to the co-wound band-segment and in the second half from the co-wound band-segment into the pieced-on band-segment. Preferably, the superconducting layers of the soldered band-segments face each other. In a second variant (see FIG. 15a, 15b) in at least one double layer, extending from one axial end of the section until the other end, the coil current is transferred from one arriving band-segment in one layer to a soldered band-segment in the next layer. The entire axial length of the section may serve this purpose; in case of a solder connection via several double layers, a multiple of the axial length of the section is available, further reducing the transition resistance. In this second variant it appears more advantageous, to simply stack the soldered band-segments in order to keep the substrate radially outward; in case the band-segments are each completely encased by an electrically highly conductive material, preferably by copper (e.g. by completely surrounding the entire band-shaped superconductor by a copper foil which on one side, preferably on the substrate side, forms a seam that is soldered), in combination with the large transfer length for the current transfer between the soldered band-segments, the ohmic transverse resistance stays within an acceptable frame. First test experiments yielded transfer resistances considerably below 1 nOhm.

In a preferred variant of the above embodiment, the section comprises two axially outer single-band partial sections, and an axially central multiple-band partial section. It is in particular preferred that the axially central multiple-band partial section comprises merely one linked band-segment. The axially central multiple-band partial section, in which the current density is reduced with respect to a single-band partial section, is then located in the central range of the magnet coil, where particularly high magnetic field strengths occur.

In a particularly preferred embodiment, the linked band-segment on the one hand and the further band-segments on the other hand are overlappingly connected with superconducting layers facing each other. Thereby, the electrical resistance between the linked band-segment and its respective further band-segments may be kept at a particularly low level. In an alternative embodiment, which may be advantageous with respect to the radial forces that appear inside the coil section, the superconducting layers in the band-segments are in both planes of the superconducting structure (i.e. in both, in the linked band-segment and also in its respective further band-segments) oriented towards the same side; typically, in a wound magnet coil for all band-segments the substrate (usually steel sheet) is oriented in a radially outward direction and the superconducting layers are oriented in a radially inward direction. In this case, the transverse current transport will usually run at least in part via soldered copper encasings of the band-segments.

In another preferred embodiment, the superconducting structure comprises at least two end band-segments, whereby each end band-segment is connected to a linked band-segment such that the linked band-segment essentially overlaps with the entire length of the end band-segments. By means of the end band-segments the superconducting structure may be terminated at both its ends and form the winding inputs or outputs, respectively, of the section/partial section. The end band-segments may be arranged in the same plane or also in different planes. Typically, the linked band-segment overlaps at least 95%, preferably at least 99% or even 100% of the length of the end band-segments.

In a particularly preferred embodiment of the superconducting structure according to the invention, the further band-segments in combination overlap with at least 95%, preferably with at least 99% of the total length of the linked band-segments. In this way, a very large contact area between the overlapping band-segments and a correspondingly small electrical resistance may be achieved. A potentially remaining (non-overlapping) length of the linked band-segments is typically allotted to a gap (or several gaps) between the further band-segments, and/or to inputs or outputs of the electrical current (in the latter cases usually at the ends of a section or partial section of the magnet coil).

In an also preferred embodiment, the linked band-segment has a length of at least 100 m, preferably at least 200 m. On the one hand, this assures that also the lengths of overlap with the further band-segments are large (usually about half of the length of the linked band-segment for each further band-segment), on the other hand, by employing such large band-segment lengths a large total length of the conductor of the coil section may be achieved in an efficient way.

In an also preferred embodiment, the superconducting structure (or the conductor of a section/partial section) comprises a total length of at least 1000 m, preferably at least 2000 m. The structure according to the invention may readily provide such large total lengths; as a result, magnet coils with high magnetic flux density may be produced.

In a preferred embodiment, a gap between two further band-segments, which are overlappingly connected to the same linked band-segment, comprises a gap width in the direction of extension of the band-segments of 5 mm or less, preferably 2 mm or less, in particular the gap may be closed for abutting further band-segments. In this way, the distance where only the linked band-segment, but not the further band-segments are available to carry the current is minimized.

In a further preferred embodiment, a gap between two further band-segments, which are overlappingly connected to the same linked band-segment, is arranged at least approximately centrally with respect to the length of this linked band-segments. As a consequence of the centered gap arrangement approximately identical lengths are available for the contact areas to the further band-segments, thereby avoiding an unbalanced increase of the contact resistance to one of the further band-segments. Typically, the gap position deviates at most 10%, preferably at most 5%, from the center of the linked band-segment, with respect to the length of the linked band-segment.

In an advantageous embodiment of the superconducting structure according to the invention, the ends of two further band-segments facing each other, which are overlappingly connected to the same linked band-segment, each taper and narrow in the direction of the other further band-segment, in particular such that a gap between these two further band-segments at least in sections runs at an angle between 5° and 30° with respect to the extension direction of the band-segments. In this variant, the gap between the further band-segments runs at least in sections inclined (and in particular not perpendicular) to the direction of extension of the linked band-segment. The gap extends via a considerable distance (in extension direction of the linked band-segment), but never reaches the full width of the superconducting structure (see typical band-widths of 2 mm to 6 cm). This design has proven useful in practice.

In a further embodiment, the superconducting layers of overlappingly connected band-segments
  are directly adjacent,
  or are connected to each other by one or more layers containing noble metals, in particular layers containing silver, and/or one or more layers containing copper, in particular copper layers. In case they are directly adjacent, in principle a very good contact (even superconducting) may be achieved between the superconducting layers; however, the jointing technology is difficult to master. In case of a connection via a normally conducting layer (or several such layers) the production of the superconducting structure becomes easier, and the layers may be used functionally (e.g. for stabilizing purposes and for quench protection). Because of the large contact areas, the normally conducting layer (or a plurality of such layers) generates only a negligible ohmic resistance if suitable materials (for example with sufficiently good electrical conductivity) and suitable layer thicknesses (not too thick) are chosen.

In a further advantageous embodiment, the band-segments of the superconducting structure comprise a shunt structure on its outer surface, in particular they may be in part or completely be encased by a shunt cover. In this way, a normally conducting current path parallel to the superconducting layers is created, that may take over the previously superconducting electrical current in case of a sudden break down of superconductivity ("quench"). In this way, overheating ("burn-out") of the superconducting layers shall be avoided. The shunt structure may in particular be made of copper.

In a preferred variant of this embodiment, two band-segments which are overlappingly connected do not overlap in one or more protruding ranges transverse to the extension direction of the band-segments, and the shunt structure is in contact with the associated band-segment in at least one of said protruding ranges. In this way, discharging of the electrical current out of the superconducting layers of the band-segments in case of a quench is particularly simplified.

A displacement of band-segments of equal width perpendicular to the extension direction may generate two protruding ranges; one or two protruding ranges may be generated by use of band-segments with different widths.

In an also particularly preferred embodiment, the superconducting layer comprises a high temperature superconductor material, in particular of the YBCO or BSCCO type. By using HTSL material, particularly high current carrying capacities (at low temperatures, e.g. by cooling with LHe) may be achieved. Within the frame of the invention, all materials with a transition temperature above 40K are designated HTSL materials. BSCCO materials may comprise $Bi_2Sr_2CaCu_2O_{8+x}$ and/or $Bi_2Sr_2Ca_2Cu_3O_{10+x}$.

In an advantageous variant of this embodiment, at least one of the further band-segments forms a joint to a wire of low temperature superconductor (=LTS), containing filaments of an LTS-superconductor material, wherein this further band-segment and the LTS-wire are overlappingly soldered to each other along at least 1 m, preferably at least 10 m, in longitudinal direction of the further band-segment by means of solder. In this way, a low-ohmic transition to the LTS wire may be produced. The joint should be arranged outside of the high field region in order to achieve a good current carrying capacity. Typically, NbTi is employed as an LTS material. Preferably, such a joint is provided at each end of the superconducting structure. In the joint area, encasings or protection covers may be removed from the filaments and/or from the superconducting layer. Within the frame of the invention, all materials with a transition temperature below 40K are designated LTS materials, in particular NbTi and Nb3Sn.

In a preferred variant, the magnet coil comprises at least one HTS-section, on its turn comprising windings of a conductor having the superconducting structure, and at least one LTS-section, on its turn comprising windings of an LTS wire. In particular, the HTS-section and the LTS-section are stacked with the HTS-section being arranged inwardly. In this way, a coil design that is suitable for particularly high magnetic field strength may be realized. The HTS-sections and the LTS-sections being connected in series, are preferably operated in a superconductive short-circuited mode, in the "persistent mode"; per se known measures against a residual drift may be employed in any usual way.

In an also preferred embodiment, a buffer layer, in particular containing CeO2 is arranged between the substrate and the superconducting layer. Thereby the quality of the superconducting layer may be improved. As the case may be, also a plurality of buffer layers may be inserted.

Embodiments Employing Three or More Band-Layers

In an also preferred embodiment of the NMR spectrometer according to the invention, the superconducting structure comprises at least in one section an M-fold band-design, with M a natural number ≥3, in which at least one of the band-segments is constructed as a multiply-linked band-segment, wherein each multiply-linked band-segment is connected to M−1 sets of at least two further band-segments each (7a-7e) in such a way that the further band-segments (7a-7e) of each set in combination overlap with at least 95% of the total length (L) of the multiply-linked band-segment (2a). By using a plurality of sets of further band-segments, the number of current paths bridging defects or gaps may be increased at each position of a multiply-linked band-segment or of a superconducting structure based on multiply-linked band-segments; in this way, the usable current density in the band-segments of the superconducting structure may be increased.

A section with double-band (2-fold band) may carry in a nearly loss-less way only about the same current as a section with a single (not pieced on) defect-free single-band, since at an abutting position in the double-band a bridging band-segment alone has to carry the entire current flow. As a result, the usable current density in a double-band is effectively about halved with respect to a single-band. Depending on the available lengths, their freedom from defects and the occurrent transverse resistance per length, it may make sense, to combine and link series (stacks) of more than two band layers (planes), e.g. three. In this way, the distance between the abutting positions (gaps) will in fact decrease; however, in this case with M layers at each position M−1 longitudinal, continuous current paths can be used. For M=3 layers, in the superconducting structure (nearly) a doubling of the single-band current or the double-band current becomes possible, since at each abutting position two current paths or bridging band-segments, respectively, are available, i.e. the effective current density of the triple-band may in fact become somewhat larger (with ca. ⅔ of the critical current density of the single-band) than that of the double-band (with ca. ½ of the critical current density of a single-band).

The effective current density may be further increased by even more layers (larger M). However, with increasing M the production of the conductors and the winding process become more difficult, more expensive and more prone to defects. Therefore, in most cases the double-band or the triple-band will be the best choice.

A design with M-fold band basically provides for the multiply-linked band-segment and also for each set one plane (band layer) in the superconducting structure, corresponding to a total of M stacked planes (band layers). Typically, a superconducting structure comprises 5 or more, preferably 20 or more multiply-linked band-segments; these are usually consecutively connected to each other, in such a way that at least one of the further band-segments in each set of a multiply-linked band-segment on its turn is a linked band-segment.

It should be noted that within the frame of the invention the magnet coil generally comprises a plurality of sections or partial sections connected in series, either wound with a single-band conductor and/or wound with a double-band having the above-described linked structure of the individual linked band-segments and/or wound with an M-fold-band with M>2, wherein, however, at least one section or partial section is wound with a multiple-band. The advantageous variants of double-band versions listed in the preceding passages may also be transferred to M-fold-bands.

In an advantageous variant of this embodiment, the gaps between two further band-segments of different sets overlapping with the same multiply-linked band-segment, are approximately evenly distributed along the length of the multiply-linked band-segment. Thereby, on the one hand, it is avoided, that gaps of different sets lie on top of each other, and, on the other hand, the lengths between the gaps in the superconducting structure may be standardized. In this way, an optimized use of the current carrying capacity of the linked band-segments is achieved.

In another preferred variant, the superconducting structure comprises a triple-band design with M=3, with band-segments arranged in three stacked layers on top of each other, the superconducting layers of the band-segments of both outer layers facing the band-segments of the central layer and the superconducting layers of the band-segments of the central layer alternatingly facing the band-segments of both outer layers. In this way, at least section-wise a low-ohmic transition between both outer layers and the central layer may be achieved.

Advantageously, gaps between the band-segments of both outer layers are displaced in longitudinal direction with respect to each other, and the superconducting layers of the band-segments of the central layer face that particular outer layer that exhibits a gap over the length of the respective band-segment of the central layer. In this way, a low-ohmic current transition from the band-segments the both outer layers to the band-segments of the central layer is provided wherever it is needed most, i.e. around the gaps, thereby keeping the total resistance of the superconducting structure at a low level. The band-segments of the central layer may in the simples way be selected half as long as the band-segments of the outer layers, furthermore each of the gaps of one of the outer layers may be arranged centrally with respect to the gaps in the other outer layer and furthermore the band-segments of the central layer each may be arranged centrally with respect to the respectively bridged gap of the outer layer.

Variant of the Invention Employing Double-Layer

The frame of the present invention also includes an NMR spectrometer with an NMR magnet coil, which is wound in at least one section with a plurality of layers in the form of a solenoid and which comprises windings of a conductor having a superconducting structure that comprises several band-segments of band-shaped superconductor connected in series, wherein each band-segment comprises a flexible, metallic substrate and a superconducting layer deposited thereon, and wherein at least two band-segments of the section are soldered to each other along a band length of at least 20 m in a normally conducting way and which are wound as a complete double layer or as a plurality of complete double layers along the band length that is soldered in a normally conducting way. In this design, both band-segments are wound along the band length that is soldered in a normally conducting way as at least one double layer, wherein each double layer extends along the entire axial length of the section. By means of the superconducting structure, two (or sequentially even more) band-segments with low electrical resistance may be linked to each other, wherein in each case an overlap of both band-segments via the band length that is soldered in a normally conducting way is provided. Because of the large length of the band length that is soldered in a normally conducting way, the ohmic resistance of the transition of the electrical current from one band-segment to the other band-segment that is connected in series is very low; in practice less than 1 nOhm transition resistance have been reached so far. At each of the axial ends of a double layer, one of both band-segments transits to a single layer (or in cases also both into a further double layer), which is wound below or on top of the double layer. By means of the transition being at the axial ends of the double layer, steps during winding of the section are avoided, eliminating peak forces generated by Lorentz-forces during operation of the magnet coil. It should be noted that the soldering of the band-segments may be performed with superconducting layers facing each other, or preferably with superconducting layers that are radially on the same side, in particular radially on the inner side. This presents advantages with respect to the radial Lorentz-forces acting upon the superconducting layers which Lorentz-forces are absorbed by the metallic substrate positioned at the outside. In combination with a copper encasement of the band-segments described further above, the ohmic transition resistance which is increased compared to the embodiment with superconducting layers facing each other may be kept within tolerable limits Incidentally, the NMR spectrometer as well as the superconducting structure, and in particular the band-segments, may be constructed according to the variant of the invention described (comprising at least one linked band-segment).

Further advantages of the invention result from the specification and the drawing. Likewise, within the frame of the invention, the features mentioned above and further below each may be used on its own or in arbitrary combinations. The embodiments as shown and described are not to be regarded as a conclusive enumeration, but have rather exemplary character for the presentation of the invention.

The invention is represented in the drawing and will be described in detail with reference to embodiments. The figures show:

BRIEF DESCRIPTION OF THE DRAWING

FIG. 1 a schematic longitudinal cut across a periodic detail of a superconducting structure for the magnet coil of an NMR spectrometer according to the invention;

FIG. 2 a schematic longitudinal cut across a superconducting structure for the magnet coil of an NMR spectrometer according to the invention, with five linked band-segments and two end band-segments;

FIG. 4a-4f schematic cross sections across various embodiments of a superconducting structure for the magnet coil of an NMR spectrometer according to the invention;

FIG. 6 a schematic longitudinal cut across a superconducting structure for the magnet coil of an NMR spectrometer according to the invention, with band-segments of varying lengths;

FIG. 7a a schematic longitudinal cut across a superconducting structure for the magnet coil of an NMR spectrometer according to the invention, with triple-band design, with evenly distributed gaps;

FIG. 7b a cross section across the superconducting structure of FIG. 7a at plane VIIb;

FIG. 11a a schematic longitudinal cut across a superconducting structure for the magnet coil of an NMR spectrometer according to the invention, wound with a superconducting structure, comprising two single-band partial sections and one double-band partial section;

FIG. 11b a schematic longitudinal cut across the unwound superconducting structure of the magnet coil of FIG. 11a;

FIG. 12a a schematic longitudinal cut across a magnet coil of an NMR spectrometer according to the invention, with an HTS section and an LTS section;

FIG. 12b a schematic cross-section across the range of overlap of a further band-segment and an LTS wire of the magnet coil of FIG. 12a in the range of cutting plane XIIb of FIG. 12a;

FIG. 14b a schematic longitudinal cut across the unwound superconducting structure of the magnet coil of FIG. 14a;

FIG. 15a a schematic longitudinal cut view of an NMR magnet coil of an NMR spectrometer according to the invention, wound with a superconducting structure two band-segments soldered to each other in a normally conducting way in a double layer;

FIG. 15b a schematic longitudinal cut across the unwound superconducting structure of the magnet coil of FIG. 15a.

DESCRIPTION OF THE PREFERRED EMBODIMENT

Figure 3B:
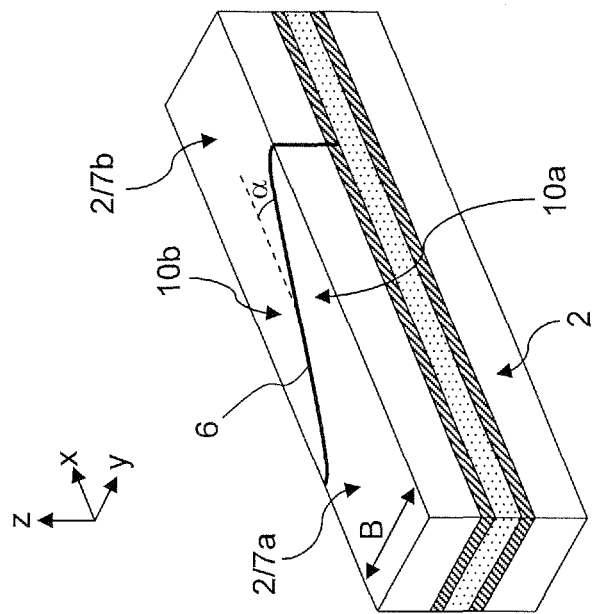
FIG. 3b a schematic tilted view onto a detail of a superconducting structure for the magnet coil of an NMR spectrometer according to the invention, in the range of a gap running in a direction inclined with respect to the extension direction.

FIG. 1 shows, in a schematic longitudinal cut detail of a superconducting structure 1 of the magnet coil of an NMR spectrometer according to the invention. The superconducting structure 1 comprises a plurality of connected band-segments of a band-shaped superconductor which are linked to each other to form a conductor running in a longitudinal direction (in FIG. 1 from left to right), the shown part of the figure comprising only so-called linked band-segments 2. The detail displays either in part or completely altogether eleven consecutive, linked band-segments 2 which are connected to each other (for simplification, in the figure only one of the band-segments is labeled with reference number 2).

Each band-segment 2 comprises a substrate 3 (e.g. made of sheet steel) and one superconducting layer 4 deposited on the substrate 3. In the example shown, the band-segments 2 are arranged in two planes (or layers) E1, E2; the band-segments 2 in the upper plane E1 have their superconducting layers 4 facing downwards (towards the lower plane E2), and the band-segments 2 in the lower plane E2 have their superconducting layers 4 facing upwards (towards the upper plane E1); i.e. the superconducting layers 4 face each other. Between the band-segments 2 of the different planes E1, E2, a solder layer 5 is arranged, which in this example consists of an alloy containing silver.

Between neighboring band-segments 2 of each plane E1, E2, in the embodiment shown, there is a gap 6 with a gap width SP that is very much smaller than the lengths L of the band-segments 2. In the detail shown, the superconducting structure 1 is periodic in extension direction (x-direction) (in each plane E1, E2, but also in total); in particular, in this example, all linked band-segments 2 comprise equal lengths L and the gaps 6 comprise equal gap widths SP.

It should be noted that FIG. 1 (and also the subsequent figures) does not show dimensions to scale, but many structural elements are displayed on an enlarged scale, in order to facilitate their recognizability. In extension direction x of the superconducting structures 1, each of the band-segments 2 typically has a length L of ten meters or more, gap widths SP (in x-direction) are typically 5 mm or less. The width of the band-segment 2 perpendicular to the plane of projection of FIG. 1 (y-direction) is typically between 2 mm and 6 cm, and the thickness of the band-segments 2 in z-direction is typically in the range of 200 μm or less, usually ca. 100 μm or less. The thickness of a superconducting layer 4 (in z-direction) is usually some μm, and the thickness of a typical solder layer 5 is usually in the range of 100 μm or less, often 25 μm or less.

The superconducting structure 1 serves the purpose, to transport an electrical current along its extension direction x (in longitudinal direction). To this end, the band-segments 2 are designed as linked band-segments 2 according to the invention. In this example, each linked band-segment 2 overlaps in x-direction with two further band-segments 7a, 7b (which here are on their turn also linked band-segments); the further band-segments 7a, 7b are overlappingly connected to band-segment 2. Thereby, the length L of linked band-segment 2 is essentially completely overlapped by the combination of both band-segments 7a, 7b; merely in the range of gap 6 between further band-segments 7a, 7b there is no overlap in the embodiment shown. Here, gap 6 is located centrally with respect to the linked band-segment 2, such that the lengths of overlap with the band-segments 7a, 7b each are about L/2.

An electrical current that has to be transported along the extension direction of the superconducting structure 1 (x-direction) in the further band-segment 7a (or in the superconducting layer 4 thereof) may be transferred via a very large area into the linked band-segment 2 (transverse current flow in z-direction), until the gap 6 blocks any further current flow in extension direction x. As a consequence, the ohmic resistance at this transition is low. After this transition, the current flow may bypass gap 6 in the linked band-segment 2. Subsequently, in a similar way, the current may transfer into the further band-segment 7b, in order to bridge the following gap, and so forth.

FIG. 2 shows also in a longitudinal cut a superconducting structure 1 of a magnet coil of an NMR spectrometer according to the invention, with here exactly five linked band-segments 2 and two end band-segments 8a, 8b; the superconducting structure 1 extending along x-direction. In this embodiment, the gaps 6 between the band-segments 2, 8a, 8b which are next to each other within both planes (layers) E1, E2 comprise a vanishing gap width (in x-direction).

Both, in the upper plane E1 left and right outer linked band-segments 2 are oriented such that their superconducting layers 4 face one of the end band-segment 8a, 8b and a linked band-segment 2 as further band-segments 7a, 7b are overlappingly connected to these via a solder layer 5. Here, the end band-segments 8a, 8b are completely overlapped in x-direction by the respective adjacent, outer linked band-segment 2.

In the embodiment shown, also a buffer layer 9 of the band-segments 2, 8a, 8b is drawn, which, for example, contains CeO2, and which is arranged between the substrate 3 and the superconducting layer 4.

The total length GL of the superconducting structure 1 in the embodiment shown in FIG. 2 is about 1200 m.

Figure 3A:
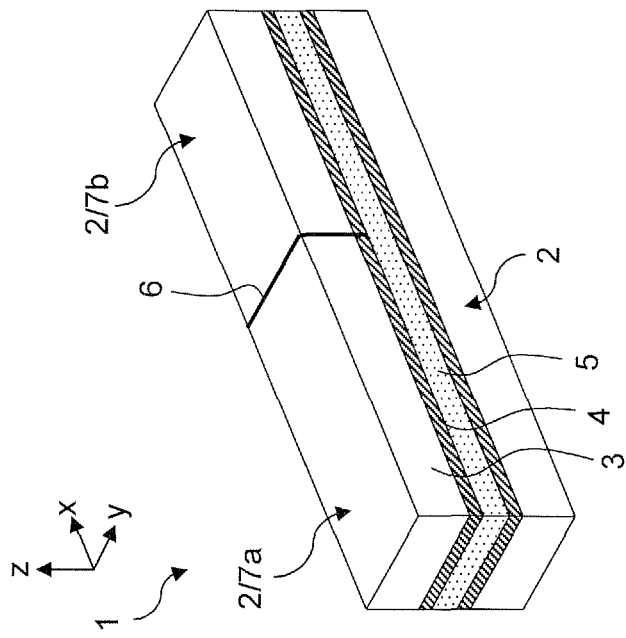
FIG. 3a a schematic tilted view onto a detail of a superconducting structure for the magnet coil of an NMR spectrometer according to the invention, in the range of a gap running in a direction transverse to the extension direction.

FIG. 3a shows in a schematic tilted view a detail of a superconducting structure 1 of a magnet coil of an NMR spectrometer according to the invention, for example of a superconducting structure as displayed in FIG. 1, in the range of a gap 6 between two linked band-segments 2 which are adjacent in the upper plane of the superconducting structure 1; both these band-segments represent further band-segments 7a, 7b with respect to the band-segment 2 in the lower plane. In the embodiment shown, gap 6 runs transverse to (perpendicular to) the extension direction x of the superconducting structure 1; this gap geometry may be produced in a particularly easy way.

However, alternatively, the gap 6 may also be inclined with respect to the extension direction (x-direction), as shown in the superconducting structure 1 of FIG. 3b. In the upper plane of the superconducting structure 1, the ends 10a, 10b of the band-segments 2 or 7a, 7b each taper in the direction towards the respectively other band-segment 2 or 7b, 7a; the ends 10a, 10b, however, essentially combine to the full width B of the two band-segments 2 or 7a, 7b. The residual gap 6 mostly runs at an angle α of about. 15° with respect to the extension direction x.

It should be noted, that, within the frame of the invention, a gap width SP will always be measured in extension direction x, even in cases where the gap 6 should be inclined with respect to the extension direction x. In case the gap width should vary along the gap 6, the gap width SP of the gap in total will consequently be determined according to the largest gap width occurring along gap 6.

In FIGS. 4a to 4f cross-sections (see plane IV in FIG. 1) across various embodiments of superconducting structures 1 of a magnet coil of an NMR spectrometer according to the invention are displayed. The position of the cross-section is selected at a distance from the gaps.

As can be seen from FIG. 4a, the adjacent, here equally wide band-segments 2 of a superconducting structure 1 may be arranged laterally (in y-direction) with respect to each other, such that perpendicularly to the extension direction x two areas of protrusion 13 remain. These are contacted by means of two shunt elements 11a, 11b, preferably made of copper, such that two normally conducting current paths parallel to the superconducting layers 4 result and thereby a shunt structure 12 is formed. Between the superconducting layers 4 (however, in this example not between the shunt elements 11a, 11b) solder containing silver is provided in order to achieve a good electrical contact.

In the embodiment of the superconducting structure 1 according to FIG. 4b two band-segments 2 of different widths are used. The narrower, upper band-segment 2 is placed centrally on the lower, broader band-segment 2 and is encased by a shunt cover 14, which also covers the protruding areas 13 of the lower band-segment 2. In the embodiment shown, the shunt cover 14 (preferably made of copper) contacts a solder layer 5, thereby ensuring a good electrical contact to both superconducting layers 4. In this way, the shunt cover 14 may easily serve as a shunt structure 12 for both band-segments 2.

In the embodiment of the superconducting structure of FIG. 4c the two adjacent, but laterally displaced band-segments 2 are completely encased by a shunt-cover 14, which analogously also contacts the protruding areas 13 (here via solder layer 5). The shunt cover 14 not only acts as a shunt structure 12, but also as a mechanical clamp for both band-segments 2.

FIG. 4d illustrates a variant of the embodiment of FIG. 4a, wherein an additional L-shaped shunt cover 14 clasps both shunt elements 11a, 11b and the upper band-segment 2. In this way, the cross-section area of the total shunt structure 12 may be increased.

It is also possible to overlap a band-segment 2 which is arranged below in the FIG. 4e with an upper band-segment 2 laterally in y-direction only in part, such that a protruding area 13 remains, and to contact this protruding area 13 with an auxiliary band-section 15. The auxiliary band-section may be linked band-segment of the superconducting structure 1 but need not. The auxiliary band-section 15 generates an auxiliary protruding area 13a, which may be contacted to a shunt element 11. The width (in y-direction) of the auxiliary protruding area 13a may be adjusted virtually at will by the width of the auxiliary band-section 15. In this way, the efficiency of the shunt structure 12 may be adjusted.

Furthermore it is possible to construct a shunt structure 12 by two shunt covers 14a, 14b (here made of copper), which each on its own encases one of both band-segments 2, and to connect the two shunt covers 14a, 14b via a solder layer 5, see FIG. 4f. In this way, between the adjacent superconducting layers 4 of the two band-segments 2 there are effectively located two copper layers 14c, 14d and one solder layer 5 (here containing silver).

Figure 5:
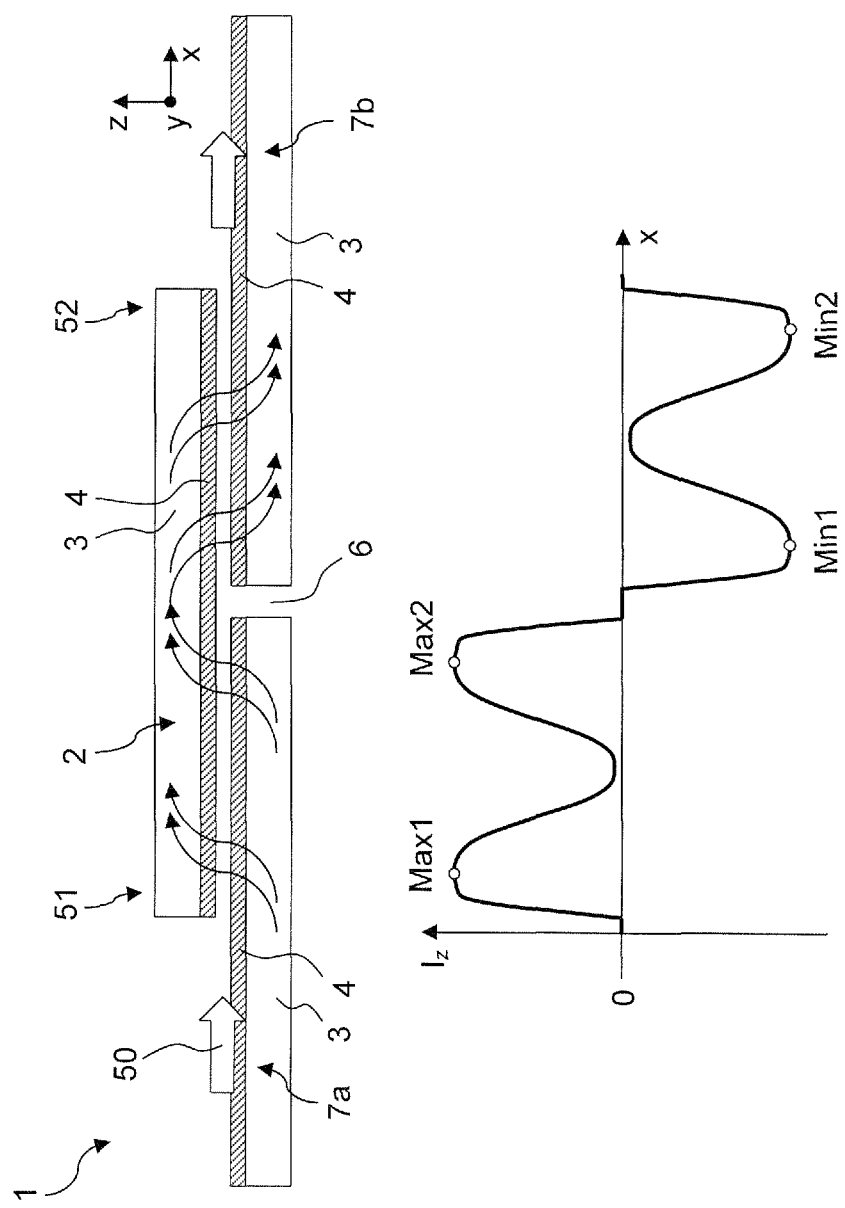
FIG. 5 a diagram schematically representing the transverse current along a linked band-segment of a superconducting structure as a function of the position along the extension direction of the superconducting structure according to the invention.

FIG. 5 illustrates the flow of an electrical current 50 in superconducting structure 1 according to the invention transported in extension direction x. The superconducting structure 1 comprises at least one linked band-segment 2 and two further band-segments 7a, 7b that are connected to the first one, which in combination completely overlap with band-segment 2 along its entire length in x-direction, apart from a gap 6 running in y-direction. In the diagram, the transverse current flow $I_z$, i.e. the current flow in z-direction perpendicularly into the superconducting layer 4 of the band-segments 2 (or, for negative sign out of this layer 4), is shown as a function of the x-position. For the sake of better clarity, the band-segments 2, 7a, 7b are represented on a somewhat expanded scale in the upper part of the figure.

At first, the transverse current $I_z$ has a maximum Max1 in the vicinity of the, in FIG. 5, left end 51 of band-segment 2, since in this area the current coming from the left and flowing through the further band-segment 7a, for the first time, may also reach and make use of the band-segment 2. Prior to gap 6, finally the entire (residual) current has to transfer from the further band-segment 7a to band-segment 2, leading to a further maximum Max2. It should be noted, that typically, Max1 and Max2 are of equal strength. Directly above gap 6 between both further band-segments 7a,7b (which have the same position with respect to z, i.e. are in one plane) no transverse current flow is possible. After the gap 6 for the first time a current may flow in the further band-segment 7b, leading to a first minimum Min1 of the transverse current $I_z$. Shortly before the right end 52 of band-segment 2 finally the entire (residual) current must transfer to the further band-segment 7b, indicated by a further minimum Min2.

An inhomogeneity of the critical current (e.g. a normally conducting defect area in a superconducting layer 4) may be bypassed by the current 50 in a similar way as a gap 6 is bypassed.

FIG. 6 shows a further embodiment of a superconducting structure 1 according to the invention, incorporating band-segments 2, 7a, 7b, 7c of different lengths (in extension direction x). The band-segments 2, 7a, 7b, 7c each comprise a substrate 3 and a superconducting layer 4.

Here, the linked band-segment labelled by reference number 2 is overlappingly connected to altogether three further band-segments, namely to the further band-segments 7a, 7b and 7c; these three band-segments 7a, 7b and 7c in combination overlap with the entire length L of linked band-segment 2. Here, the length L of the linked band-segment 2 is about 1.5 times as large as the length L7c of further band-segment 7c. By using band-segments 2, 7a, 7b, 7c of different lengths in the superconducting structure 1, waste of the expensive band-shaped superconductor may be avoided or at least reduced.

However, during production of the superconducting structure 1 one should make sure that in the range around a known defect area in a band-segment, a band-segment bridging this defect area is free of known defect areas. For example, the further band-segment 7c, bridging a known defect area FB of the linked band-segment 2 (e.g. a normally conducting spot in the superconductor layer 4 of the linked band-segment 2), is free of known defect areas within a first longitudinal range LB1, extending before and behind the defect area FB over at least 10 m, respectively.

It should also be ensured that around a gap a band-segment bridging this gap is free of known defect areas. For example, around the gap between the further band-segments 7a, 7c, this gap being denoted in FIG. 6 by reference number 6, the linked band-segment 2 is free of known defect areas (e.g. normally conducting spots in the superconductor layer 4 of the linked band-segment 2) within a second longitudinal range LB2, extending in this case before and behind the defect area FB over at least 10 m, respectively.

If during planning one takes into account these basic principles, which and where band-segments can be overlappingly connected to each other, it becomes readily possible to also make use of band-segments with known defect areas; the known defect areas may be bridged in a similar way as gaps with the consequence that in total they do not hamper any more the current carrying capacity. Waste resulting from known defect areas in band-segments can thereby be minimized.

It should be noted, that here the further band-segment 7c is not regarded to constitute a linked band-segment, since it overlaps with only one band-segment, namely band-segment 2. In contrast, the further band-segments 7a, 7b on their turn are linked band-segments in the sense of the invention, and the band-segments 7a, 2 and 7c may be regarded to constitute sequentially connected linked band-segments.

Whereas FIGS. 1 to 6 each showed superconducting structures with a double-band design, FIG. 7a represents a superconducting structure 1 according to the invention, comprising a multiple-band design with band-segments in more than two planes (layers), specifically three planes (layers) E1, E2, E3. Again, the band-segments each comprise a substrate 3 and a superconducting layer 4.

In the embodiment shown the superconducting structure 1 is composed of a multitude of multiply-linked band-segments 2a (for the sake of simplicity, only one of those is labelled in FIG. 7a) and of four end band-segments 8a-8d. As an example, the multiply-linked band-segment labelled 2a, shall now be considered in more detail:

The entire length L of multiply-linked band-segment 2a located in the upper plane E1 is overlapped in the central plane E2 by the combination of further band-segments 7a, 7b (with the exception of gap 6 between the band-segments 7a, 7b). Thus, the further band-segments 7a, 7b form a first set of further band-segments 7a, 7b, being overlappingly connected to the multiply-linked band-segment 2a.

Furthermore, the entire length L of the multiply-linked band-segment 2a is overlapped in the lower plane E3 by the combination of the further band-segments 7c, 7d (with the exception of gap 6 between the band-segments 7c, 7d). The further band-segments 7c, 7d therefore form a second set of further band-segments 7c, 7d, being overlappingly connected to the multiply-linked band-segment 2a.

It should be noted that the further band-segments 7a-7d on their turn constitute linked band-segments, which are each completely overlapped by two sets of further band-segments (with the exception of gaps 6).

The gaps 6 between the further band-segments 7c, 7d and 7a, 7b are located at about ⅓ and ⅔ of the length L of the multiply-linked band-segment 2a, and are therefore distributed evenly along the length L of the multiply-linked band-segment 2a. In this way, lengths corresponding to about ⅓ of the length L of the multiply-linked band-segments 2a are always available for current transfers.

In the shown embodiment the superconducting layers 4 of all band-segments are oriented to face the same side (upwards). Such a design is advantageous with respect to the force distribution within a magnet coil wound with the superconducting structure 1. The transverse current balance between the planes E1, E2, E3 may in this case be facilitated by a shunt-cover 14, e.g. of copper, encasing the superconducting structure 1, see FIG. 7b, which shows a cross-section in FIG. 7a at cutting plane VIIb. For example, electrical current may transfer laterally from the central superconducting layer 4 of plane E2 into the shunt-cover 14 which has good conductivity and (at another longitudinal position) again laterally transfer from that into the superconducting layer 4 of the lower plane E3.

Figure 8:
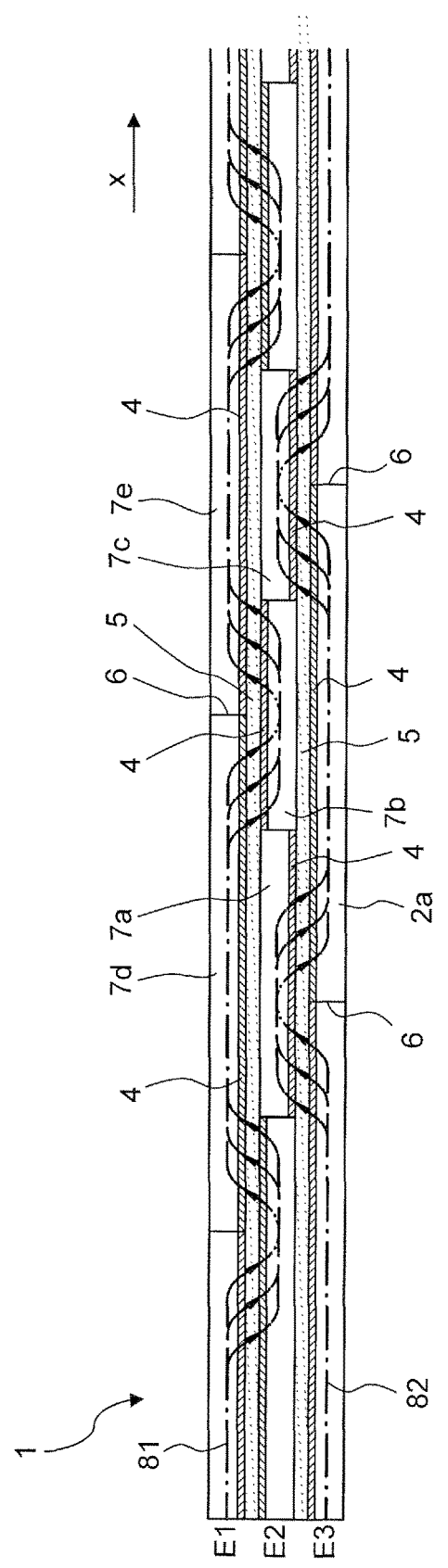
FIG. 8 a schematic longitudinal cut across a superconducting structure for the magnet coil of an NMR spectrometer according to the invention, with triple-band design, with alternatingly oriented superconducting layers of the band-segments in the central layer.

A direct transverse current transfer between band-segments of different planes E1, E2, E3 may be effected by an alternating orientation of the superconducting layer 4 in the central plane E2 of a superconducting structure 1 with triple-band design, i.e. an orientation changing from band-segment to band-segment in the plane E2, as represented in FIG. 8.

In the embodiment shown, the superconducting layers 4 of the band-segments of the upper plane (layer) E1 and of the lower plane (layer) E3 are both oriented towards the central plane (layer) E2. The band-segments of the central plane E2 are each oriented such that their respective superconducting layers 4 face that plane E1, E3, that happens to comprise a gap 6.

This shall be exemplified and illustrated with respect to the multiply-linked band-segment (labelled with reference number 2a) of the lower plane E3. This multiply-linked band-segment 2a is overlapped by a set of the further band-segments 7a, 7b, 7c of the central plane E2 and by a set of the further band-segments 7d, 7e of the upper plane E1. In order to bridge the gaps 6 at the left and right ends of the multiply-linked band-segment 2a, the superconducting layers 4 of the further band-segments 7a and 7c face the multiply-linked band-segment 2a (and its superconducting layer 4). In order to bridge the gap 6 between the further band-segments 7d, 7e, the superconducting layer 4 of the further band-segment 7b faces the further band-segments 7d, 7e (and their superconducting layers 4). A good electrical contact may in each case be achieved by using a solder 5 with good electrical conductivity (preferably containing a noble metal) between the superconducting layers 4.

Then, in the superconducting structure 1 of FIG. 8, the electrical current may flow along two essentially superconducting current paths 81, 82 in a longitudinal direction (x-direction). In current path 81 the current flow changes between the upper plane E1 and the central plane E2, the current deviating at each of gaps 6 in the upper plane E1 laterally via the central plane E2. In current path 82 the current flow changes between the lower plane E3 and the central plane E2, the current path deviating at each of gaps 6 in the lower plane E3 laterally via the central plane E2.

It should be noted that in this embodiment the band-segments of the central plane E2 each is about half as long as the band-segments of the outer planes E1, E3.

Figure 9:
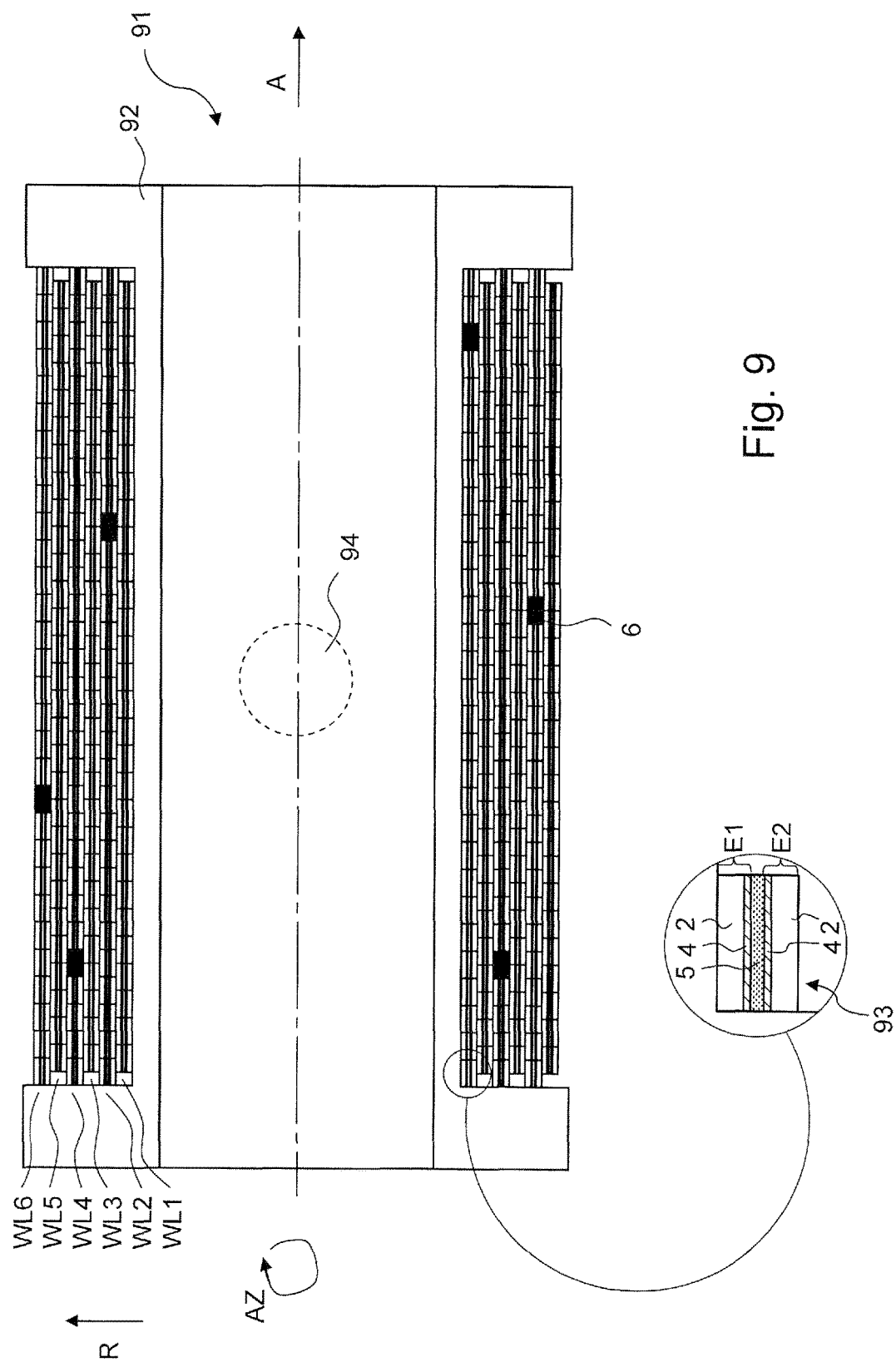
FIG. 9 a schematic longitudinal cut across a superconducting structure for the magnet coil of an NMR spectrometer according to the invention, wound with a superconducting structure, being constructed as a double-band.

According to the invention, superconducting structures, as presented in FIGS. 1 to 8, are used in an NMR magnet coil of an NMR spectrometer. FIG. 9 exemplifies an NMR magnet coil 91 to be used according to the invention with a coil section, which is wound with a superconducting structure having the double-band design (as e.g. represented in FIG. 1 to FIG. 6). In this example, the winding is carried out in the manner of a solenoidal coil.

The double-band 93, see the enlarged detail at the bottom of FIG. 9, comprises linked band-segments 2 in two planes E1, E2, the superconducting layers 4 of the overlapping linked band-segments 2 facing each other, and a solder 5 being introduced between the superconducting layers 4.

On a coil form 92, the double-band 93 is wound with a plurality of radial winding layers WL1-WL6 (here displayed: six winding layers), each winding layer WL1-WL6 on its turn comprising a plurality of axially sequential windings. By means of the wound double-band 93, a homogeneous magnetic field in axial direction is generated in a sample volume 94 located in an axial bore of the coil form 92. Here, the sample volume 94 covers at least 1 cm$^3$, preferably at least 10 cm$^3$ and comprises a homogeneity of 100 ppm or better, preferably 10 ppm or better, both without shimming or prior to a shimming procedure, respectively, i.e. without further homogenization by means of shim coils driven by independent shim currents and/or without ferromagnetic shim platelets; after shimming, much better homogeneities in the sample volume 94 may be achieved, about $10^{-9}$ or better, preferably $10^{-10}$ or better. In the sample volume 94, preferably a magnetic field of 10 Tesla or more, preferably 20 Tesla or more may be generated. Here, the sample volume 94 is indicated to be of spherical shape; it should be noted that in general the sample volume may also cover a cylindrical space, typically with a circular base area with a radius of 2.5 to 7.5 mm and a longitudinal extension in axial direction of at least 20 mm, preferably at least 40 mm.

Gaps (abutments) 6 will occur In the double-band 93, their respective positions being indicated in FIG. 9 by a black labelling of the winding. In the embodiment shown, there are six gaps 6 in the displayed longitudinal cut.

In order to keep mechanical stresses by Lorentz-forces at a low level in an NMR coil, e.g. the NMR magnet coil 91, the superconducting structure with the sequence of its gaps 6 is designed such (by selection of the lengths of the linked band-segments), that mechanically weak spots are avoided. According to the invention, gaps 6 should in particular not be positioned radially on top of each other (see radial direction R), and also not be axially adjacent to each other (see axial direction A). Gaps 6 occur between two sequential band-segments lying in the same (band-)plane E1, E2, in particular between two further band-segments which are connected to the same linked band-segment.

In general, in case two gaps 6 occur in windings of the same winding layer WL1-WL6, these gaps should be azimuthally displaced (see azimuthal direction AZ), in particular by at least 30°. This criterion may be achieved most easily by providing at most one gap 6 per winding layer WL1-WL6. It is also preferred not to have gaps 6 in the same winding layer WL1-WL6 in axially directly adjacent windings; preferably at least two, particularly preferred at least three complete windings should lie in between gaps 6.

Furthermore, it should generally be ensured in case of gaps 6 which are located in different winding layers WL1-WL6, but which occur at the same axial position, that these gaps 6 are at an azimuthal distance, preferably at least 30°. It is also preferred that in case gaps 6 in different winding layers WL1-WL6, occur at the same axial position, they should not occur in neighboring winding layers.

It is particularly preferred that all gaps 6 (irrespective of their assignment to particular layers or of their azimuthal position) are displaced from each other in axial direction, in particular by at least the widths of three windings. It is also particularly preferred that all gaps 6 (irrespective of their assignment to particular layers or of their azimuthal position) are displaced from each other in azimuthal direction, in particular by at least 30°.

Figure 10:
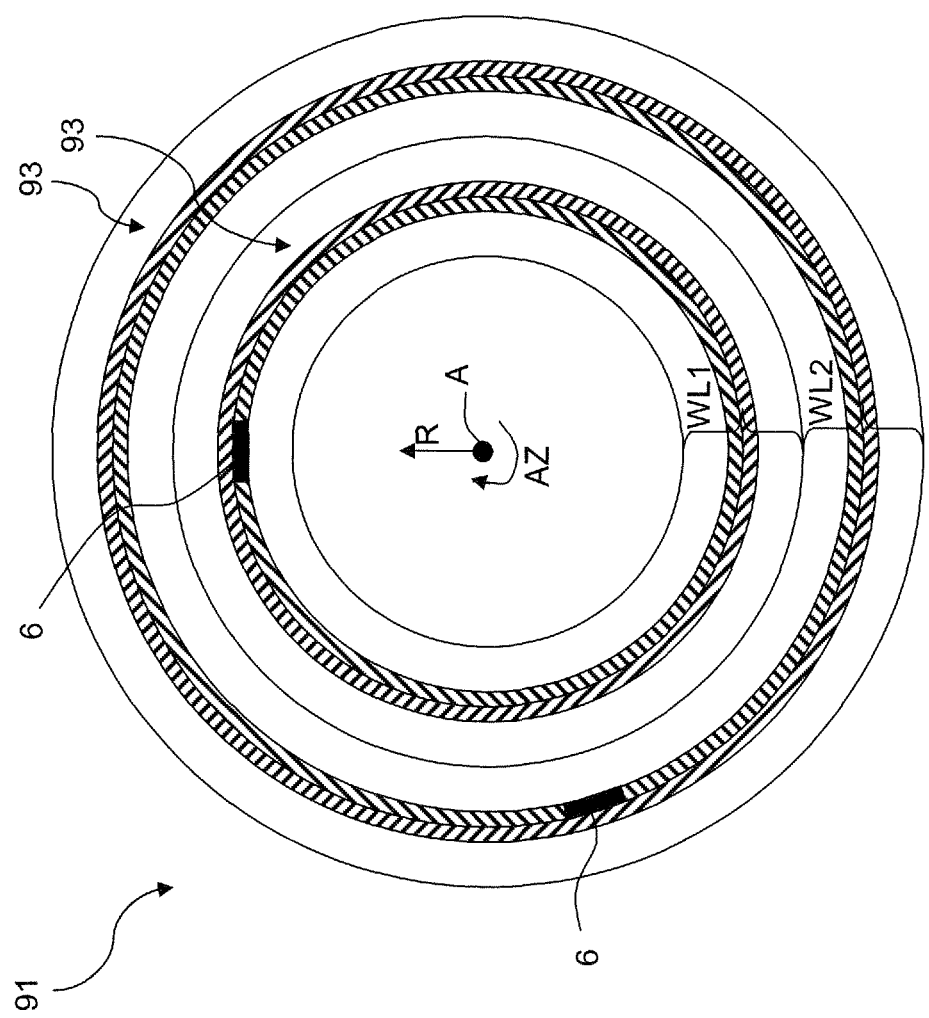
FIG. 10 a schematic longitudinal cut across a superconducting structure for the magnet coil of an NMR spectrometer according to the invention, with azimuthally distributed gaps.

In FIG. 10, there is illustrated another NMR magnet coil 91 according to the invention in a cross-sectional view. This magnet coil 91 comprises two winding layers WL1, WL2 of a double-band 93. In this magnet coil 91 two gaps 6 occur, which are labelled in the displayed cross-section by black sectors and which are at an azimuthal distance (here about 100°), in order to keep the mechanical weakening of the magnet coil 91 caused by gaps 6 low.

FIG. 11a shows another embodiment of an NMR magnet coil 91 of an NMR spectrometer according to the invention in a longitudinal cut. The NMR magnet coil 91 comprises a coil section having three partial sections 111, 112, 113 which are considered to be connected electrically in series), which are wound onto a coil form 92. FIG. 11b shows the set-up of the wound, interconnected superconducting structure 1.

In the first, left partial section 111 the superconducting structure 1 is designed with a single-band 114. In the second, central partial section 112 the superconducting structure is designed with a multiple-band 115, namely a double-band 93; this partial section 112 comprises a gap 6. The third, right partial section 113 is again designed as a single-band 114.

The partial sections of the coil section running as single-bands 114 are formed by further band-segments 7a, 7b, which are, in the range of the partial section of the coil section that runs as double-band 93, overlappingly connected to a linked band-segment 2. Thus, the linked band-segment 2 acts here as a joint located in the coil section between the further band-segments 7a, 7b.

FIG. 12a illustrates an NMR magnet coil 91 of an NMR spectrometer according to the invention, having two radially stacked coil sections 121, 122, being superconductively connected in series.

The inner, first coil section 121 is wound with a superconducting structure of band-segments as for example described in the FIGS. 1 to 8; there the band-segments are coated by high temperature superconductor material, here YBCO, therefore the first coil section 121 represents an HTS-section 121.

The second, outer coil section 122 is wound with an LTS wire 124 containing filaments of low temperature superconductor material, here Nb3Sn, therefore this second coil section represents an LTS-section 122.

The superconducting structure of the HTS-section 121 is led out of the first coil section 121 by a partial section of a further band-segment 7a. This further band-segment 7a forms a joint 125 with an LTS wire 123, here containing filaments of NbTi, the further band-segment 7a and the LTS wire 123 being overlappingly connected to each other over a length of 1 m or more, preferably over 10 m or more; the range of overlap may be wound up as shown, in order to achieve a compact construction. As represented in FIG. 12*b*, which shows a cross-section across the range of overlap of joint 125 in the cut plane XIIb of FIG. 12*a*, the further band-segment 7a and the LTS wire 123 are two-dimensionally connected to each other via a solder 127 (which typically contains noble metals and/or copper). In the embodiment shown, the LTS wire 123 had been rolled flat and etched away in its upper part, such that at least a part of the filaments 128 may be directly contacted by solder 127. The superconducting layer 4 of the further band-segment 7a faces solder 127 and is here also directly contacted by solder 127, resulting in a particularly low transition resistance.

As can in turn be seen in FIG. 12*a*, the LTS wire 123 (NbTi-wire) is connected to the LTS wire 124 (Nb3Sn-wire) of the second coil section 122 by means of a conventional joint 126.

Using such a joint design makes it possible, to connect the HTS-section 121 and the LTS-section 122 in a simple and reliable and quasi superconductive way. In particular, the entire NMR magnet coil 91 may be operated in a superconductingly short-circuited mode of operation ("persistent mode"), using two joints as represented in FIG. 12 and typically also a superconducting switch (not detailed).

Figure 13:
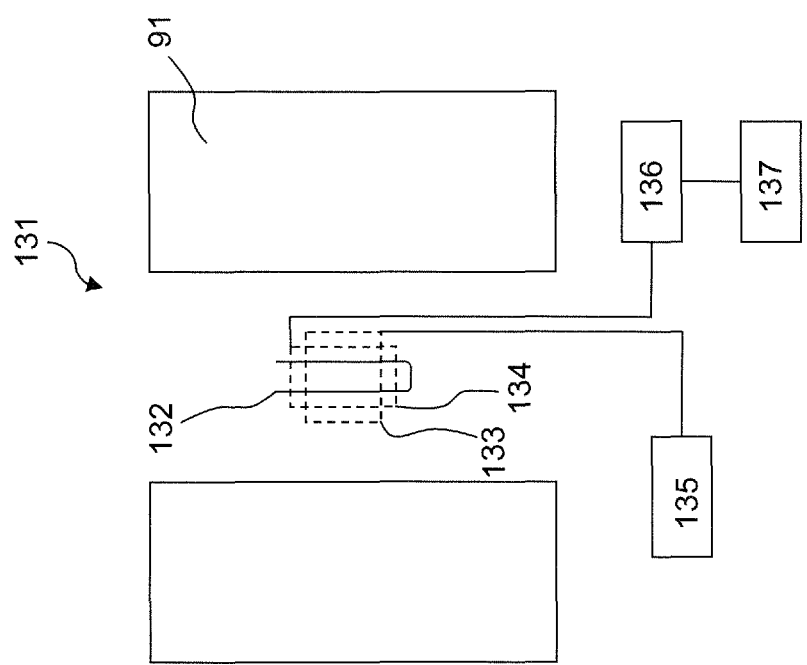
FIG. 13 a schematic representation of an NMR spectrometer according to the invention.

FIG. 13 schematically represents an NMR spectrometer 131 according to the invention in an exemplary way.

The NMR spectrometer 131 comprises an NMR magnet coil 91, as for example described in FIG. 12 or FIG. 14 or FIG. 15, which is typically arranged inside a cryostat (not detailed). In a sample volume, located in the magnetic center of the magnet coil 91, a sample 132 (e.g. a sample tube filled with a substance to be investigated) is arranged. The sample 132 is surrounded by an RF-transmission coil 133 and an RF-detection coil 134 (it should be noted, that in other designs combined RF-transmission- and detection coils are possible). By means of an RF-generator 135 and detection coil 133 RF-pulses are transmitted into the sample 132. By means of an RF-detector 136 and the RF-detection coil 134 the response of the sample 132 is registered. The measuring results are processed by an evaluation unit 137, and for example transformed into an NMR-spectrum.

An NMR spectrometer 131 according to the invention preferably complies with the requirements of high resolution NMR-spectroscopy.

Figure 14A:
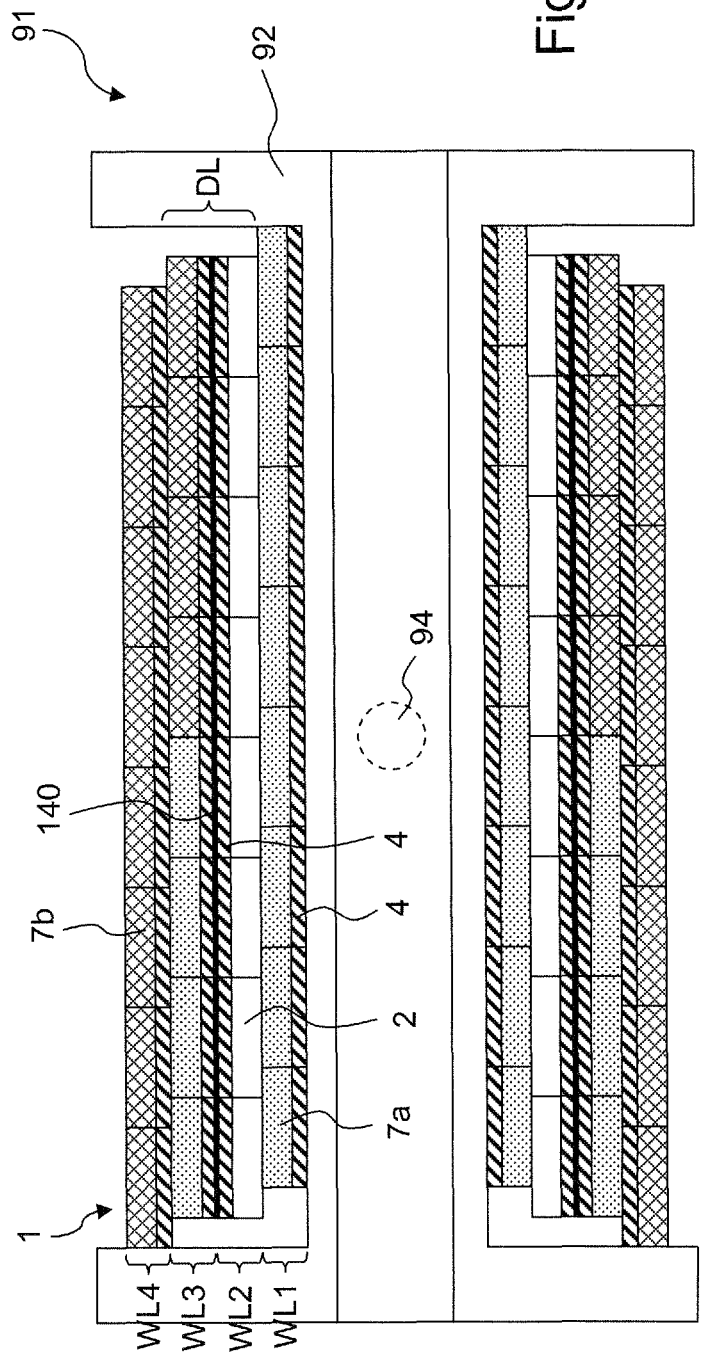
FIG. 14a a schematic longitudinal cut view of an NMR magnet coil of an NMR spectrometer according to the invention, wound with a linked band-segment in a double layer.
Figure 14B:
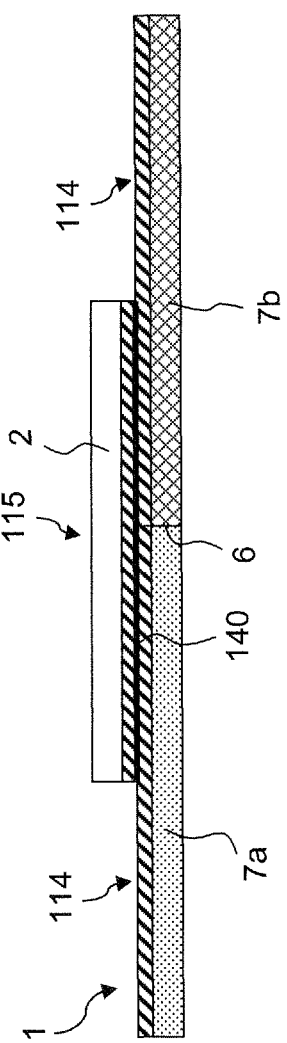

FIG. 14*a* shows in a longitudinal cut an NMR magnet coil 91 of an NMR spectrometer according to the invention in a further embodiment. On the coil form 92 there is arranged superconducting structure 1, comprising one linked band-segment 2 and two further band-segments 7a, 7b, wound up in the way of a solenoidal coil with in this case altogether four winding layers WL1-WL4. As can also be seen in the unwound representation of FIG. 14*b*, the first winding layer WL1 is wound as a single-band 114 by the further band-segment 7a. The second winding layer WL2 is wound by the linked band-segment 2. Half of the third winding layer WL3 (here the left half) is wound by the further band-segment 7a (dotted), and the other half (here the right half) by the further band-segment 7b (cross-hatched); the third winding layer WL3 therefore comprises a gap 6. The fourth winding layer WL4 is wound by the second, further band-segment 7b as a single-band 114. The winding layers WL2 and WL3 form a double-layer DL or a multiple-band 115, respectively. In the double-layer DL the band-segments 2 and 7a as well as 2 and 7b are overlappingly connected to each other, in this case, soldered to each other in a normally conducting way (see solder layer 140).

Here, the superconducting layers 4 of the further band-segments 7a, 7b are each oriented radially inwards, whereas the superconducting layer 4 of the linked band-segment 2 is oriented radially outwards; therefore in the double-layer DL the superconducting layers 4 of the winding layers WL2 and WL3 face each other, allowing a particularly low transition resistance.

It should be noted that, depending on the available defect-free band length, also two or more winding layers may be wound as a single-band 114 each inwardly and/or outwardly with the further band-segments 7a,7b. Likewise, within a coil section one may several times switch, as described above, from a single-band 114 to a multiple-band 115 and back.

In FIG. 15*a* a further NMR magnet coil 91 of an NMR spectrometer according to the invention is represented. On a coil form 92, comprising a bore with a sample volume 94, a superconducting structure 1 is wound in the way of a solenoidal coil, here comprising two band-segments 150, 151 in altogether four winding layers WL1, WL2, WL3, WL4. As can also be seen in the unwound representation of FIG. 15*b*, in the first winding layer WL1 the first band-segment 150 (dotted) is wound as a single-band 114. The second winding layer WL2 is also wound with the first band-segment 150. The third winding layer WL3 is wound with the second band-segment 151 (white). The fourth winding layer WL4 is wound as a single-band 114 also with the second band-segment 151. The winding layers WL2 and WL3 form a double-layer DL or a multiple-band 115, respectively. In the double-layer DL, the band-segments 150 and 151 are overlappingly connected to each other along a band length 152, namely soldered to each other in a normally conductive way (see solder layer 140). The superconducting layers 4 of both band-segments 150, 151 are oriented radially inward or their substrates 3 are oriented radially outwards, respectively, thereby preventing during operation detaching of the superconducting layers 4 by Lorentz-forces. In this embodiment, the double-layer DL forms a joint for the two band-segments 150, 151, making exact use of the total axial length of the shown section of the NMR magnet coil 91. By the joint the band-segments 150, 151 are electrically connected in series. According to the invention, the band length 152 being soldered in a normally conducting way amounts at least to 20 m, in order to keep the transition resistance low. In the embodiment von FIG. 15*a*-15*b* it is exactly one (complete) double-layer along the total length of the coil or section, respectively, but it may also require any integer number of (complete) double-layers, in particular exactly two or exactly three or even more (complete) double-layers. Hence, the transitions from a single-band 114 to a multiple-band 115 always occur at axial ends of the coil or section, respectively.

It should be noted that, depending on the available defect-free band length, also two or more winding layers may be wound as a single-band 114 each inwardly and/or outwardly with the further band-segments 150, 151.

Moreover, also both ends (but not the central part) of one or more band-segments may be soldered in a normally conductive way to other band-segments, in order to thereby connect in series more than two band-segments in an easy way; the respective band lengths soldered in a normally conducting way (with a length of at least 20 m) form again at least one double-layer in the NMR magnet coil.

Figure 15C:
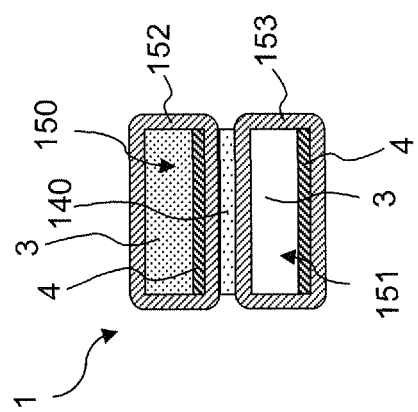
FIG. 15c a schematic cross-section across the superconducting structure of FIG. 15b in the double-band range.

Furthermore, FIG. 15c represents a cross-section across the superconducting structure 1 in the range of the double-layer DL (in this context see FIG. 15b, plane XVc). The band-segments 150, 151 are each encased by a highly conductive cover 152, 153, in particular a copper cover (e.g. made of copper foil with a thickness of about. 50 μm). The encasements 152, 153 are soldered to each other, see solder layer 140, the superconducting layers 4 each being oriented radially inwards (in FIG. 15c downwards). In particular the left and the right side sections of the encasement 153 and the sections of encasements 152, 153 that are arranged directly on the superconducting layers 4 and on the solder layer 140, respectively, provide an essential contribution to the ohmic connection of the superconducting layers 4 of the band-segments 150, 151.

The substrates 3 of the band-segments 150, 151 are made of flexible, metallic material, e.g. of sheet steel. The superconducting layer 4 typically comprises a high temperature superconductor material of the YBCO- or BSCCO-type. For the normally conducting solder, in particular solders may be used that contain noble metals and/or copper.

The invention claimed is:

1. An NMR spectrometer having an NMR-magnet coil with at least one section having windings of conductors with a superconducting structure, wherein the superconducting structure comprises:
a plurality of band-segments of band-shaped superconductors, each band-segment comprising a flexible substrate and a superconducting layer deposited thereon, each band-segment having a length of at least 20 meters, said band-segments being jointed to each other, wherein at least one of said band-segments is a linked band-segment and at least two of said band-segments are further band-segments, said linked band-segment being connected to said two further band-segments in such a way that electrical current flows between said linked band-segment and said two further band-segments, said two further band-segments having a combined overlap with at least 95% of a total length of said linked band-segment, wherein said linked band-segment is free of defects within a longitudinal range around a gap between said two further band-segments.

2. The NMR spectrometer of claim 1, wherein at least one linked band-segment comprises at least one known defect area, and at least one of said two further band-segments overlaps with said defect area and is selected and/or positioned in a longitudinal direction in such a way, that said overlapping further band-segment is free of defects in said longitudinal range about said defect area or is free of defects in said longitudinal range through at least 10 m on both sides of said defect area.

3. The NMR spectrometer of claim 1, wherein the section comprises windings in a plurality of radial winding layers, and gaps between said two further band-segments, which are overlappingly connected to a same linked band-segment, are azimuthally separated in winding layers that radially lie on top of each other.

4. The NMR spectrometer of claim 2, wherein the section comprises windings in a plurality of radial winding layers, and gaps between said two further band-segments, which are overlappingly connected to a same linked band-segment, are azimuthally separated in winding layers that radially lie on top of each other.

5. The NMR spectrometer of claim 1, wherein the section comprises at least one single-band partial section wound with a single continuous band-segment and also comprises at least one multiple-band partial section, which is wound with a conductor having the superconducting structure.

6. The NMR spectrometer of claim 2, wherein the section comprises at least one single-band partial section wound with a single continuous band-segment and also comprises at least one multiple-band partial section, which is wound with a conductor having the superconducting structure.

7. The NMR spectrometer of claim 5, wherein the section comprises two axially outer single-band partial sections and an axially central multiple-band partial section or an axially central multiple-band partial section having only one linked band-segment.

8. The NMR spectrometer of claim 6, wherein the section comprises two axially outer single-band partial sections and an axially central multiple-band partial section or an axially central multiple-band partial section having only one linked band-segment.

9. The NMR spectrometer of claim 1, wherein said linked band-segment and said two further band-segments are overlappingly connected with superconducting layers thereof facing each other.

10. The NMR spectrometer of claim 1, wherein outer surfaces of said band-segments comprise a shunt structure or comprise a shunt cover in which they are partially or completely encased.

11. The NMR spectrometer of claim 2, wherein outer surfaces of said band-segments comprise a shunt structure or comprise a shunt cover in which they are partially or completely encased.

12. The NMR spectrometer of claim 5, wherein outer surfaces of said band-segments comprise a shunt structure or comprise a shunt cover in which they are partially or completely encased.

13. The NMR spectrometer of claim 6, wherein outer surfaces of said band-segments comprise a shunt structure or comprise a shunt cover in which they are partially or completely encased.

14. The NMR spectrometer of claim 7, wherein outer surfaces of said band-segments comprise a shunt structure or comprise a shunt cover in which they are partially or completely encased.

15. The NMR spectrometer of claim 8, wherein outer surfaces of said band-segments comprise a shunt structure or comprise a shunt cover in which they are partially or completely encased.

16. The NMR spectrometer of claim 1, wherein said superconducting layer comprises a high temperature superconductor material, a YBCO-type material or a BSCCO-type material, wherein at least one of said two further band-segments forms a joint to a wire of low temperature superconductor (LTS) containing filaments of an LTS superconductor material, wherein, by means of solder, that further band-segment and said LTS wire are overlappingly soldered to each other along at least 1 m or at least 10 m in a longitudinal direction of that further band-segment.

17. The NMR spectrometer of claim 1, wherein at least one section of said superconducting structure comprises an M-fold band-design, M being a natural number ≥3, in which at least one of said band-segments is constructed as a multiply-linked band-segment, wherein each multiply-linked band-segment is connected to M−1 sets of at least two further band-segments each and in such a way that combined further band-segments of each set overlap with at least 95% of a length of said multiply-linked band-segments.

18. The NMR spectrometer of claim 17, wherein gaps between said two further band-segments of different sets overlapping with a same multiply linked band-segment, are approximately evenly distributed along said length of said multiply-linked band-segment.

19. The NMR spectrometer of claim 17, wherein the superconducting structure comprises a triple-band design with said band-segments arranged in three stacked layers on top of each other, wherein superconducting layers of said band-segments of both outer layers face said band-segments of a central layer and said superconducting layers of said band-segments of said central layer alternatingly face said band-segments of both outer layers.

20. The NMR spectrometer of claim 19, wherein gaps between said band-segments of both said outer layers are displaced in a longitudinal direction with respect to each other and said superconducting layers of said band-segments of said central layer face a particular outer layer that exhibits a gap over a length of a respective said band-segment of said central layer.

21. An NMR spectrometer having an NMR-magnet coil, which is wound in at least one section with a plurality of layers in a form of a solenoid and which comprises windings of a conductor having a superconducting structure, the superconducting structure having several band-segments of band-shaped superconductor connected in series, wherein each band-segment comprises a flexible, metallic substrate and a superconducting layer deposited thereon, wherein at least two band-segments of said section are soldered to each other along a band length of at least 20 m in a normally conducting way and are wound as a complete double layer or as a plurality of complete double layers along a band length that is soldered in a normally conducting way.

* * * * *